United States Patent
Wegener

(10) Patent No.: US 11,245,416 B2
(45) Date of Patent: Feb. 8, 2022

(54) PARALLEL, BLOCK-BASED DATA ENCODING AND DECODING USING MULTIPLE COMPUTATIONAL UNITS

(71) Applicant: ANACODE LABS, INC., Watsonville, CA (US)

(72) Inventor: Albert W Wegener, Aptos Hills, CA (US)

(73) Assignee: ANACODE LABS, INC., Watsonville, CA (US)

( * ) Notice: Subject to any disclaimer, the term of this patent is extended or adjusted under 35 U.S.C. 154(b) by 338 days.

(21) Appl. No.: 16/333,579

(22) PCT Filed: Jun. 20, 2017

(86) PCT No.: PCT/US2017/038349
§ 371 (c)(1),
(2) Date: Mar. 14, 2019

(87) PCT Pub. No.: WO2017/223095
PCT Pub. Date: Dec. 28, 2017

(65) Prior Publication Data
US 2019/0260387 A1  Aug. 22, 2019

Related U.S. Application Data

(60) Provisional application No. 62/352,367, filed on Jun. 20, 2016.

(51) Int. Cl.
*H03M 7/30* (2006.01)
*G06F 3/06* (2006.01)
(Continued)

(52) U.S. Cl.
CPC ............ *H03M 7/40* (2013.01); *G06F 3/0608* (2013.01); *G06F 3/0661* (2013.01);
(Continued)

(58) Field of Classification Search
CPC ........ H03M 7/30; H03M 7/3059; H03M 7/42; H03M 7/6011; G06F 9/3885
See application file for complete search history.

(56) References Cited

U.S. PATENT DOCUMENTS

| 8,275,897 | B2* | 9/2012 | Fallon | H03M 7/30 |
| | | | | 709/231 |
| 2002/0097172 | A1* | 7/2002 | Fallon | H03M 7/4006 |
| | | | | 341/51 |

(Continued)

FOREIGN PATENT DOCUMENTS

| WO | 2014056458 A1 | 4/2014 |
| WO | 2015196126 A1 | 12/2015 |

OTHER PUBLICATIONS

Sitaridi, et al., "Massively-Parallel Lossless Data Decompression," IEEE 45th Int'l Conf on Parallel Processing (ICPP) Aug. 16-19, 2016, 10 pages.

(Continued)

*Primary Examiner* — Emily E Larocque
*Assistant Examiner* — Huy Duong
(74) *Attorney, Agent, or Firm* — Haynes Beffel & Wolfeld LLP

(57) ABSTRACT

Massively parallel, block-based encoding and decoding technology that includes an encoded block format uses a plurality of processing cores to perform block-based encoding and decoding operations. The encoded block format includes a header and a payload. The encoded block format's headers represent unique single-Byte and multi-Byte event parameters that occur in the original data block from which each encoded block was generated. The encoded block format's payloads represent a sequence of single-Byte and multi-Byte events using tokens that associate each event (Continued)

with its corresponding parameter(s). Metadata can include an array of encoded block sizes that support random access.

6 Claims, 36 Drawing Sheets

(51) Int. Cl.
  *H03M 7/42* (2006.01)
  *H03M 7/40* (2006.01)
(52) U.S. Cl.
  CPC ............ *G06F 3/0673* (2013.01); *H03M 7/30* (2013.01); *H03M 7/3059* (2013.01); *H03M 7/42* (2013.01); *H03M 7/6011* (2013.01)

(56) References Cited

U.S. PATENT DOCUMENTS

| | | | |
|---|---|---|---|
| 2003/0078935 | A1 | 4/2003 | Zibin et al. |
| 2004/0210763 | A1 | 10/2004 | Jonas |
| 2006/0235895 | A1 | 10/2006 | Rodriguez et al. |
| 2007/0008191 | A1 | 1/2007 | Archbold et al. |
| 2010/0324914 | A1 | 12/2010 | Stachurski et al. |
| 2012/0045142 | A1 | 2/2012 | Demidov et al. |
| 2012/0057616 | A1 | 3/2012 | Padilla et al. |
| 2012/0093234 | A1 | 4/2012 | Rosenzweig et al. |
| 2014/0028480 | A1* | 1/2014 | Fallon ................ H04L 29/0604 341/87 |
| 2014/0044190 | A1* | 2/2014 | Kalevo ............... H04N 19/154 375/240.18 |
| 2014/0140359 | A1 | 5/2014 | Kalevo et al. |
| 2016/0198171 | A1 | 7/2016 | Wu et al. |

OTHER PUBLICATIONS

Sumo Logic, "AWS 101: An Overview of Amazon Web Services," May 21, 2019, 19 pages.
Ticki, "On Random-Access Compression," http://ticki.github.io/blog/on-random-access-compression, Oct. 23, 2016, 8 pages.
Van Winkle, "Optimal Bit Packing," Code Plea Blog, Nov. 21, 2009, 4 pages.
Welch, "A Technique for High-Performance Data Compression," IEEE Computer, vol. 17, Issue 6, Jun. 1984, 12 pages.
White, "Private vs. Public Cloud: What's the Difference," https://www.expedient.com/blog/private-vs-public-cloud-whats-difference/, 2018, 5 pages.
Ziv et al. "A Universal Algorithm for Sequential Data Compression," IEEE Transactions on Information Theory, vol. IT-23, No. 3, May 1977, 7 pages.
Chang et al., "A simple block-based lossless image compression scheme", 11th Asilomar Conference on Circuits, Systems, and Computers, https://www.researchgate.net/publication/3698187_A_simple_block-based_lossless_image_compression_scheme, 1977.
Wahba, et al., "Lossless Image Compression Techniques Comparative Study", https://www.researchgate.net/publication/296674534_Lossless_Image_Compression_Techniques_Comparative_Study, International Research Journal of Engineering and Technology (IRJET), vol. 3, Issue 2, Feb. 2016.
Gupta, "Study of Various Lossless Image Compression Technique", https://pdfs.semanticscholar.org/9262/f1ea98da9af034edbc5375e10f259dccd83c.pdf, International Journal of Emerging Trends & Technology in Computer Science (IJETTCS), vol. 2, Issue 4, Jul.-Aug. 2013.
"Everything about the data compression", https://en.wikipedia.org/wiki/MSU_Lossless_Video_Codec,Moscow State University (MSU) web page, retrieved Jan. 21, 2020; last edited Jul. 10, 2019; last software update: Sep. 19, 2005 (v0.6.0).
"An new parallel algorithm for LZ77 compression based on suffix array," https://github.com/zfy0701/Parallel-LZ77, as early as Jan. 2013, 2 pages.

"Enable Payload Compression for an API," AWS Documentation, https://docs.aws.amazon.com/apigateway/latest/developerguide/api-gateway-gzip-compression-decompression.html, downloaded Sep. 2019, 2 pages.
"Google Cloud Platform Overview," https://cloud.google.com/docs/overview, 2019, 7 pages.
"How does ZFS Block Level Deduplication fit with Variable Block Size?", ServerFault, https://serverfault.com/questions/302584/how-does-zfs-block-level-deduplication-fit-with-variable-block-size, as early as Sep. 2011, 3 pages.
"How to enable the compression option in a REST service," Stackoverflow, https://stackoverflow.com/questions/27295926/how-to-enable-the-compression-option-in-a-rest-service, Dec. 2014, 3 pages.
"HTTP Methods," Rest API Tutorial, https://restfulapi.net/http-methods/, Downloaded Sep. 2019, 12 pages.
"Payload (computing" TechTarget Network, https://searchsecurity.techtarget.com/definition/payload, Mar. 2019, 5 pages.
"Performance Guidelines for Amazon S3," AWS, https://docs.aws.amazon.com/AmazonS3/latest/dev/optimizing-performance-guidelines.html, as early as Jan. 2019, 4 pages.
"Reading, Parsing and Unpacking," Bitstring, https://pythonhosted.org/bitstring/reading.html, downloaded in Sep. 2019, 5 pages.
Run-Length Encoding (RLE), http://eem.eskisehir.edu.tr/ongerek/EEM562/icerik/rle.pdf, as early as Jan. 1999, 5 pages.
"S3 Object: Get Object," EMC ECS REST API, http://doc.isilon.com/ECS/3.3/API/S3ObjectOperations_getObject_f5c497b5fc79a08b9164ec22fa9016b7_ba672412ac371bb6cf4e69291344510e_detail.html, downloaded Sep. 2019, 2 pages.
Adamson, "Huffman encoding parallelization," https://pdfs.semanticscholar.org/3c42/43470e99ea83173053ba7a38db7be1cb0121.pdf, as early as Jan. 2017, 5 pages.
Adler, "pigz: A parallel implementation of gzip for modern multiprocessor, multi-core machines," https://zlib.net/pigz/, Dec. 26, 2017, 1 page.
Almeida, et al., "Two High-Performance Alternatives to ZLIB Scientific-Data Compression,": B. Burgante et al. (Eds) ICCSA 2014, Part IV, LNCS 8582, Jun. 30-Jul. 3, 2014, 16 pages.
Alvarado, "What compression tools are available in Ubuntu that can benefit from a multi-core CPU?" https://askubuntu.com/questions/258202/multi-core-compression-tools, Feb. 19, 2013, 7 pages.
Amazon Simple Storage Service, API Reference, API Version Mar. 1, 2006, 800 pages.
Baker, "Decompression with pigz is not parallel," https://github.com/madler/pigz/issues/36, Sep. 22, 2016, 3 pages.
Benkovic, "Bit-level packing and unpacking," http://www.hashmismatch.net/libraries/packed-struct/, as early as Jan. 2015, 4 pages.
Bondy, "What is the best compression algorithm that allows random reads/writes in a file?" StackOverflow, https://stackoverflow.com/questions/236414/what-is-the-best-compression-algorithm-that-allows-random-reads-writes-in-a-file, Dec. 2008, 5 pages.
Burrows, et al., "A Block-sorting Lossless Data Compression Algorithm," Digiital SRC Research Report, May 10, 1994, 24 pages.
Burtscher et al., "High Throughput Compression of Double-Precision Floating-Point Data," IEEE Data Compression Conference, Mar. 27-29, 2007, Snowbird, UT.
Coleman S., "Specify byte range via query string in Get Object S3 request," StackOverflow, https://stackoverflow.com/questions/26964626/specify-byte-range-via-query-string-in-get-object-s3-request/28166834, Nov. 17, 2014, 3 pages.
DeAgostino, "Lempel-Ziv Data Compression on Parallel and Distributed Systems," Algorithms, 4, Sep. 14, 2011, 17 pages.
Deutsch, "GZIP file format specification version 4.3," Aladdin Enterprises, May 1996, 13 pages.
Emms, "Best Linux Multi-Core Compression Tools," LinuxLinks, https://www.linuxlinks.com/best-linux-multi-core-compression-tools, Jan. 9, 2019, 6 pages.
Ferjani, "Flyimg: Resize, Crop and Compress images," https://www.slideshare.net/sadoknet/flyimg-resize-crop-and-compress-images-on-the-fly, May 12, 2018, 20 pages.

(56) References Cited

OTHER PUBLICATIONS

Fielding et al., "Hypertext Transfer Protocol—HTTP/1.1," http://www.w3.org/Protocols/rfc2616/rfc2616.txt, Jun. 1999, 152 pages.
Govindan et al., "IDBE—An Intelligent Dictionary Based Encoding Algorithm for Text Data Compression for High Speed Data Transmission Over Internet," Proc. of Int'l Conf on Intelligent Signal Processing, Feb. 2004, 8 pages.
Handsaker et al., "bgzip—Block compression/decompression utility," htslib-1.9, Jul. 18, 2018, 3 pages.
Jones et al., "JSON Web Encryption (JWE)," <http://www.rfc-editor.org/rfc/pdfrfc/rfc7516.txt.pdf>, May 2015, 51 pages.
Kanjilal, "Compressing Web API responses to reduce payload," InfoWorld, https://www.infoworld.com/article/3174597/compressing-web-api-responses-to-reduce-payload.html, Feb. 27, 2017, 12 pages.
KinematicSoup Blog, "Data Compression: Bit-Packing 101," Sep. 6, 2016, 16 pages, https://www.kinematicsoup.com/news/2016/9/6/data-compression-bit-packing-101.
Klein et al., "Parallel Huffman decoding," Proc. Data Compression Conference DCC 2000, Mar. 28-30, 2000, 10 pages.
Latja, "Parallel Acceleration of H.265 Video Processing," Thesis, Aalto University, School of Science, Dec. 5, 2019, 72 pages.
Lemire "Fast integer compression: decoding billions of intergers per second," Daniel Lemire's blog (https://lemire.me/blog/2012/09/12/fast-integer-compression-decoding-billions-of-integers-per-second/), Sep. 12, 2012, 10 pages.
Levine et al., "FFT-Based Digital Audio Compression," Center for Computer Research in Music and Acoustics (CCRMA), Dept. of Music, Stanford University, Stanford, California, Mar. 31, 2019, 9 pages.
Li, "Random access to zlib compressed files," Heng Li's blog, Jul. 5, 2014, 2 pages.
Linux Info, "Packet Header Definition," http://www.linfo.org/packet_header.html, Dec. 14, 2005, 1 page.
Loughman, "An Overview of Microsoft Azure Services," Feb. 6, 2019, 9 pages.
Mahoney, "Large Text Compression Benchmark," https://cs.fit.edu/~mmahoney/compression/text.html, as early as Jan. 2007, 48 pages.
Meenderinck et al., "Parallel Scalability of H.264," Proceedings of the first Workshop on Programmability Issues for Multi-Core Computers, Jan. 2008.
Moffat, "Word Based Text Compression," Journal of Software: Practice and Experience, Feb. 1989, 17 pages.
P. Bryan, ed., "JavaScript Object Notation (JSON) Patch," https://tools.ietf.org/html/rfc6902. Apr. 2013, 19 pages.
Pasternack, "MiGz for Compression and Decompression," https://engineering.linkedin.com/blog/2019/02/migz-for-compression-and-decompression, Feb. 20, 2019, 4 pages.
PCT/US2018/031061—International Search Report and Written Opinion dated Jul. 20, 2018, 12 pages.
Pekhimenko, et al., "Exploiting Compressed Block Size as an Indicator of Future Reuse," IEEE 21st Int'l Symp. on High-Performance Architecture, Feb. 7-11, 2015, 13 pages.
Rosen, "REST Resource Representation Compression," REST API Tutorial, https://restfulapi.net/rest-resource-compression/, as early as Jan. 2019, 5 pages.
Schlegel et al., "Fast Integer Compression using SIMD Instructions," Proceeding DaMoN '10, Proceedings of the Sixth International Workshop on Data Management on New Hardware, Indianapolis, IN, Jun. 7, 2010, 7 pages.
Shun et al., "Practical Parallel Lempel-Ziv Factorization," IEEE Proc Data Compression Conf. DCC, Mar. 20-22, 2013, 10 pages.
PCT/US2017/038349—International Preliminary Report on Patentability dated Jan. 3, 2019, 7 pages.
PCT/US2017/038349—International Search Report dated Oct. 25, 2017, 13 pages.
PCT/US2017/038388—International Preliminary Report on Patentability dated Dec. 25, 2018, 7 pages.
PCT/US2017/038388—International Search Report and Written Opinion dated Nov. 13, 2017, 13 pages.
PCT/US2018/031061—International Preliminary Reporton Patentability (IPRP) dated Nov. 14, 2019, 6 pages.
U.S. Office Action from U.S. Appl. No. 16/333,580 dated Sep. 24, 2020, 15 pages.

* cited by examiner

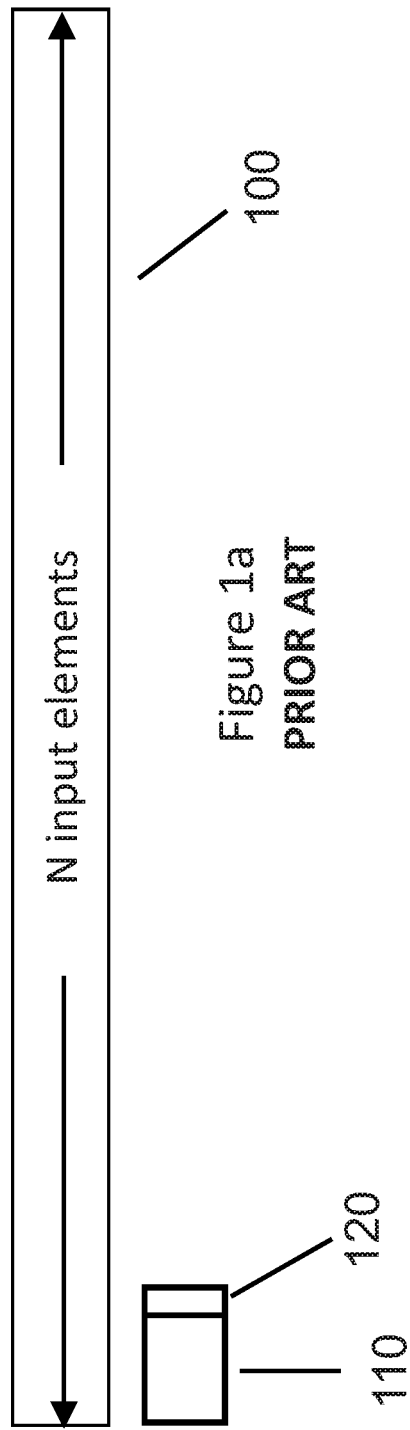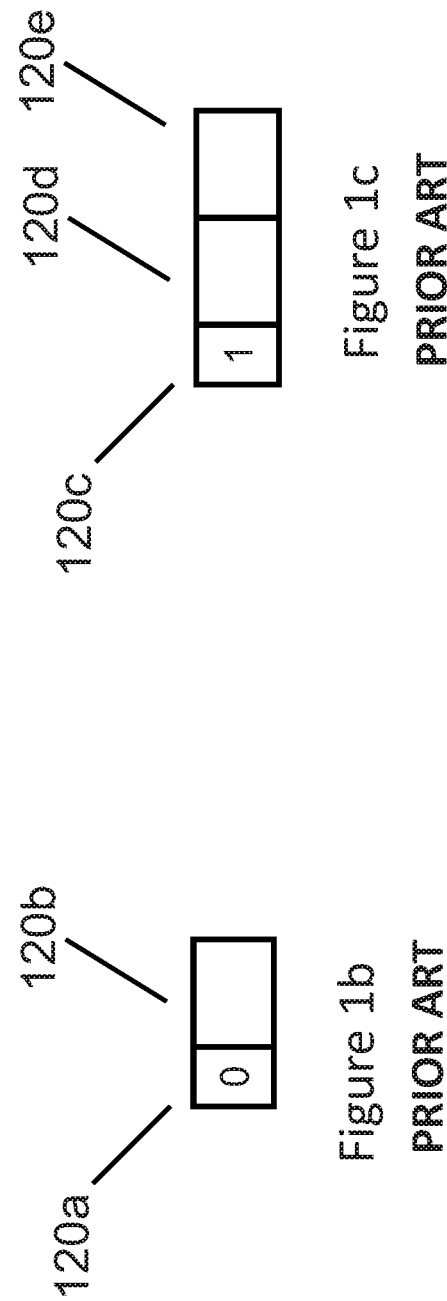

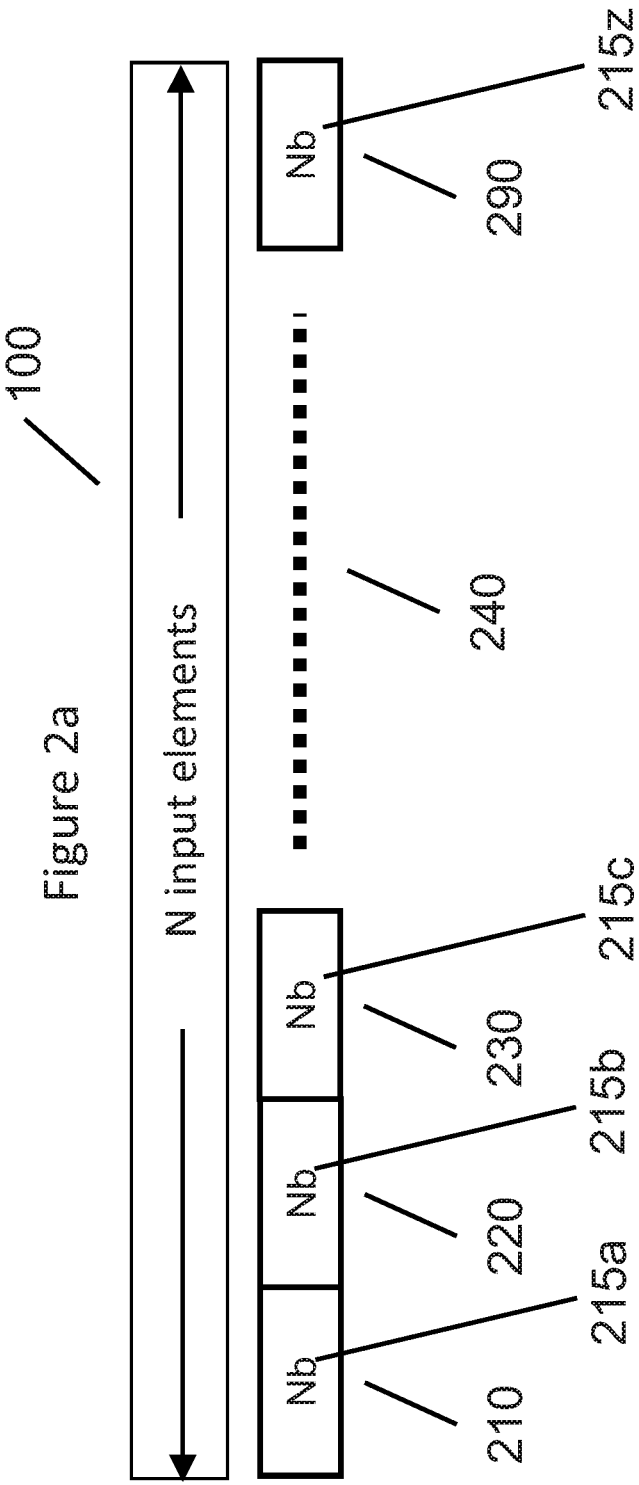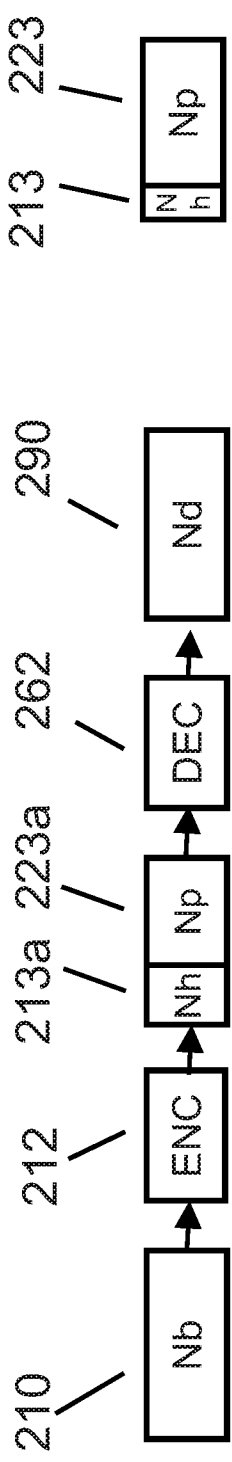

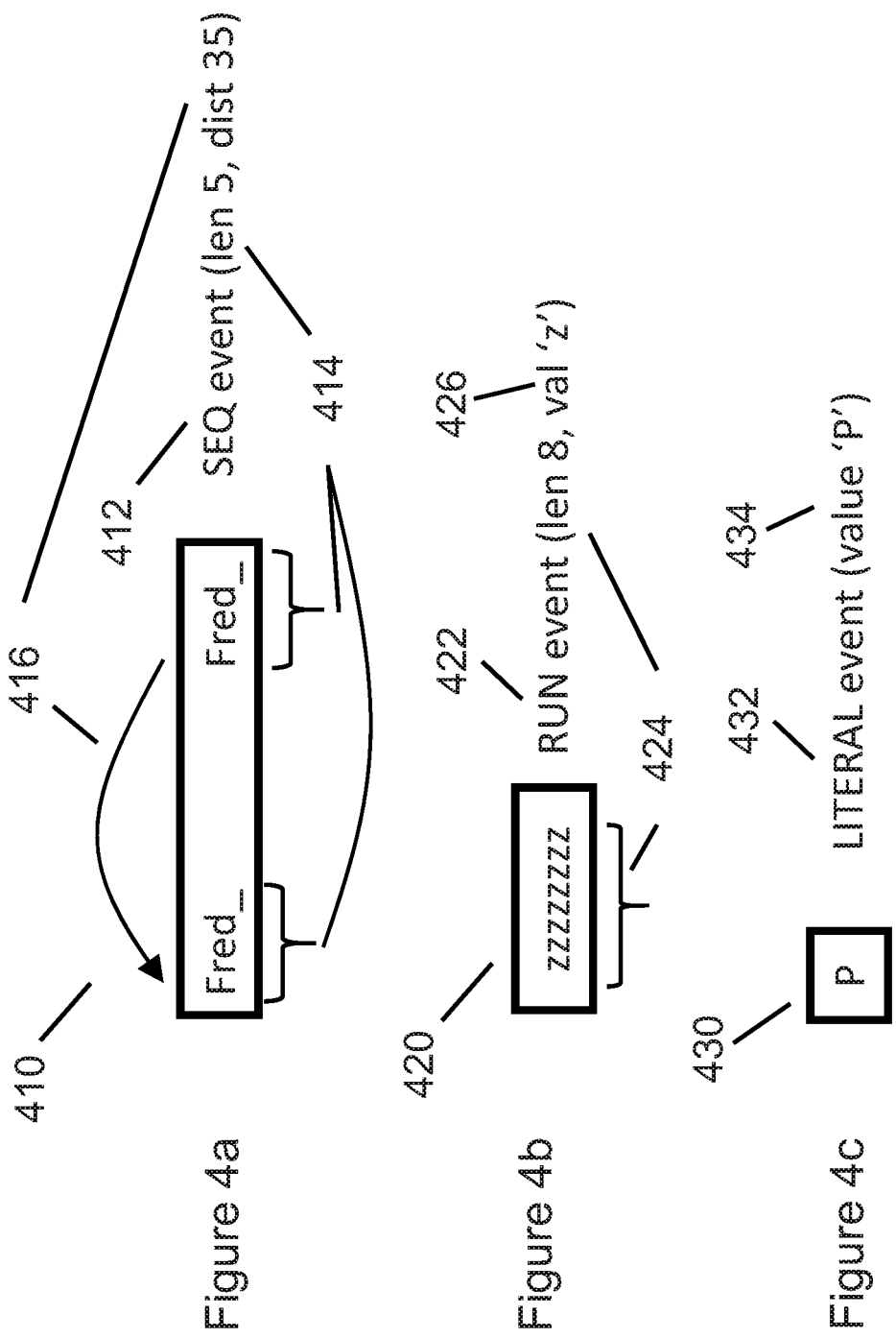

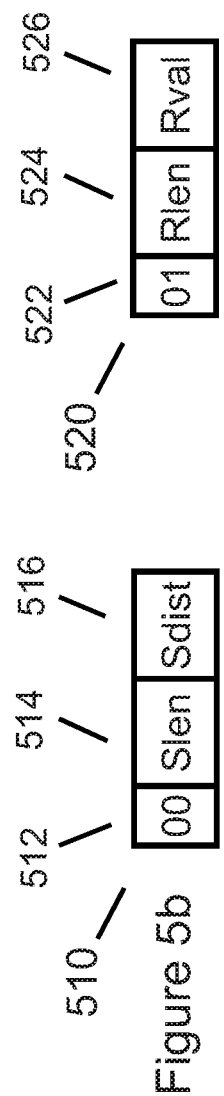

— 313b

- Nse: # Seq Events — 610
- NuSL: # seq lengths — 620
- Nbits: # bits per SL — 630
- SLu[NuSL], each Nbits wide — 640
- SLtok_tableNum — 650

| i → | 1 | 2 | 3 | ... | NuSL |
|---|---|---|---|---|---|
| SLunique[i] | 5 | 4 | 6 | ... | 53 |
| SLtok[i] | 00 | 01 | 10 | ... | 11001 |
| SLtokLen[i] | 2 | 2 | 2 | ... | 5 |

640 — SLunique[i]
660 — SLtok[i]
670 — SLtokLen[i]
620 — NuSL
650 — {SLtok[i], SLtokLen[i]}

Figure 7a
 — 313c
- 710 — Nre: # Run Events
- 720 — NuRL: # unique run lengths
- 730 — Nbits: # bits per RL
- 740 — RLu[NuRL], each Nbits wide
- 750 — RLtok_tableNum
Figure 7b
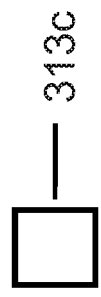 — 313d
- 760 — NuRV: # unique run values
- 770 — RVu[NuRV], each 8 bits wide
- 780 — RVtok_tableNum
Figure 7c
| i → | 1 | 2 | 3 | ... | NuRL |
|---|---|---|---|---|---|
| RLu[i] | 3 | 2 | 4 | ... | 22 |
| RLtok[i] | 00 | 01 | 10 | ... | 11001 |
| RLtokLen[i] | 2 | 2 | 2 | ... | 5 |
740, 795, 790, 750, 720

Figure 8a
 313g
- Nde: # Dictionary Events — 810
- NuDict: # unique dictionary words — 820
- dictWord[NuDict] — 830
Figure 8b
444
| wordID[i] | 1 | 2 | 3 | . . . | NuDict |
|---|---|---|---|---|---|
| dictWord[i] | 'and' | 'the' | 'Fred' | . . . | 'quirky' |
830
Figure 8c
 323h
840
| i → | 1 | 2 | 3 | . . . | Nde |
|---|---|---|---|---|---|
| wordList[i] | 'the' | 'Fred' | 'the' | . . . | 'and' |
| wordID[i] | 2 | 3 | 2 | . . . | 1 |
444

- Nlit: # LIT Events
- NuL: # unique LIT values
- uLIT[NuL], each 8 bits wide
- LIT_tableNum

| i → | 1 | 2 | 3 | . . . | NuL |
|---|---|---|---|---|---|
| uLit[i] | 'e' | 't' | 'a' | . . . | 'Q' |
| LITtok[i] | 000 | 001 | 010 | . . . | 111001 |
| LITtokLen[i] | 3 | 3 | 3 | . . . | 6 |

```
// Advance file pointer to the Anacode startBlk (where decoding begins).
                                                1540
if (startBlk) {                    // if first block is NOT block 0,
    iBlk = 0;      1710            // iBlk counts encoded blocks
    j = 0;                         // j accumulates # dwords to seek
    while (iBlk < startBlk)        // while iBlk < startBlk,
        j += cIndex[iBlk++];       //     accumulate encoded block sizes
1720                       1410
    fseek(encFile, 4 * j, SEEK_CUR);  // seek past the first 4 * j Bytes
}
```

Figure 17

```
       1560   1810         1520
j0 = NtossStart;                     // skip the first "NtossStart" Bytes
i = fwrite(&uBuf[j0], 1, NBytes, uncFile);  // write N2write decoded Bytes
```

Figure 18

Figure 19a *modified from Fig. 9b*

| i → | 1 | 2 | 3 | 4 | 5 |
|---|---|---|---|---|---|
| uLit[i] | 'e' | 't' | 'a' | 'r' | Q |
| count[i] | 483 | 212 | 56 | 13 | 2 |

930 — uLit[i]
1910 — count[i]
1905

Figure 19b

| TokTab # | Field | 1 | 2 | 3 | 4 | 5 |
|---|---|---|---|---|---|---|
| 1 | tokens | 0 | 10 | 110 | 1110 | 1111 |
|   | tokLens | 1 | 2 | 3 | 4 | 4 |
| 2 | tokens | 00 | 01 | 10 | 110 | 111 |
|   | tokLens | 2 | 2 | 2 | 3 | 3 |
| 3 | tokens | 0 | 100 | 101 | 110 | 111 |
|   | tokLens | 1 | 3 | 3 | 3 | 3 |

| TokTab # | 1 | 2 | 3 | 4 | 5 | Nbits |
|---|---|---|---|---|---|---|
| 1 | 1 * 483 | 2 * 212 | 3 * 56 | 4 * 13 | 4 * 2 | 1135 |
| 2 | 2 * 483 | 2 * 212 | 2 * 56 | 3 * 13 | 3 * 2 | 1547 |
| 3 | 1 * 483 | 3 * 212 | 3 * 56 | 3 * 13 | 3 * 2 | 1332 |

1920a, 1920b, 1920c
1930a, 1930b, 1930c

| Event → | 1 | 2 | 3 | 4 | 5 | 6 | 7 | 8 | 9 | 10 |
|---|---|---|---|---|---|---|---|---|---|---|
| Event type: | DICT | DICT | LIT | SEQ | DICT | LIT | RUN | LIT | SEQ | RUN |
| param 1 | 3 | 4 | 's' | 3 | 3 | 't' | 8 | 'e' | 4 | 3 |
| param 2 | -- | -- | -- | 6 | -- | -- | 'z' | -- | 17 | 'f' |

DICT 3 DICT 4 LIT 's' SEQ 3 6 DICT 3 LIT 't'

RUN 8 'z' LIT 'e' SEQ 4 17 RUN 3 'f'  — 2050

Figure 20b

DICT DICT LIT SEQ DICT LIT RUN LIT SEQ RUN — 323a

DICT IDs: 3 4 3 — 323b
       — 323c: 's' 't' 'e'   (LIT IDs)
SEQ LENS: 3 4 — 323d
       — 323e: 6 17   (SEQ DISTS)
RUN LENS: 8 3 — 323f
       — 323g: 'z' 'f'   (RUN VALS)

Figure 20c

| Use Case | Block Size (Bytes) |
|---|---|
| Cache lines | 32 or 64 |
| Hard Disk Drives | 512 |
| Ethernet | 1,500 |
| Solid State Disks (MLC Flash) | 2,048 or 4,096 |
| Virtual Memory (OS) | 4,096 |
| Solid State Disks (TLC Flash) | 16,384 |

Figure 22

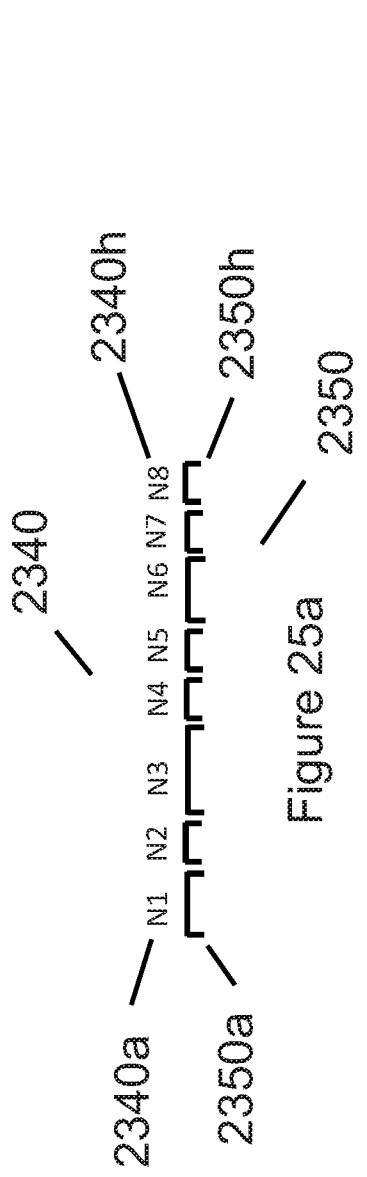
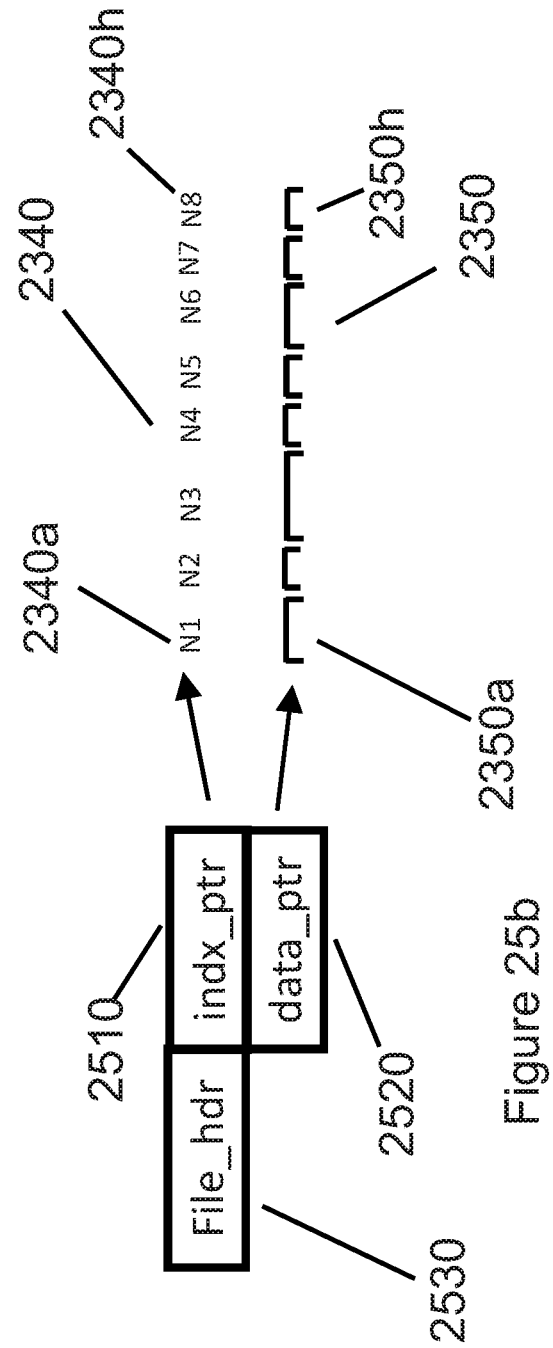
Figure 25a
Figure 25b

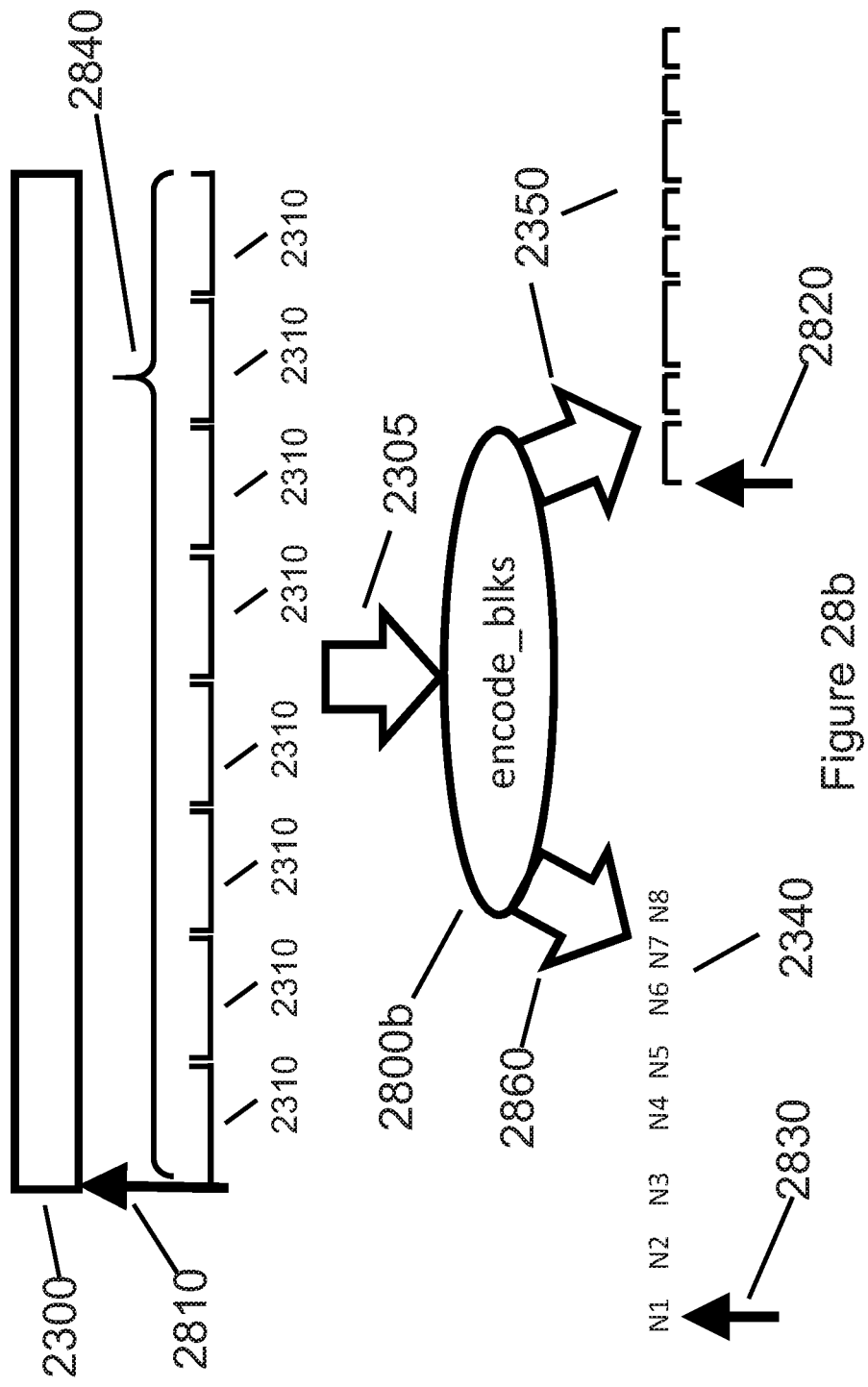

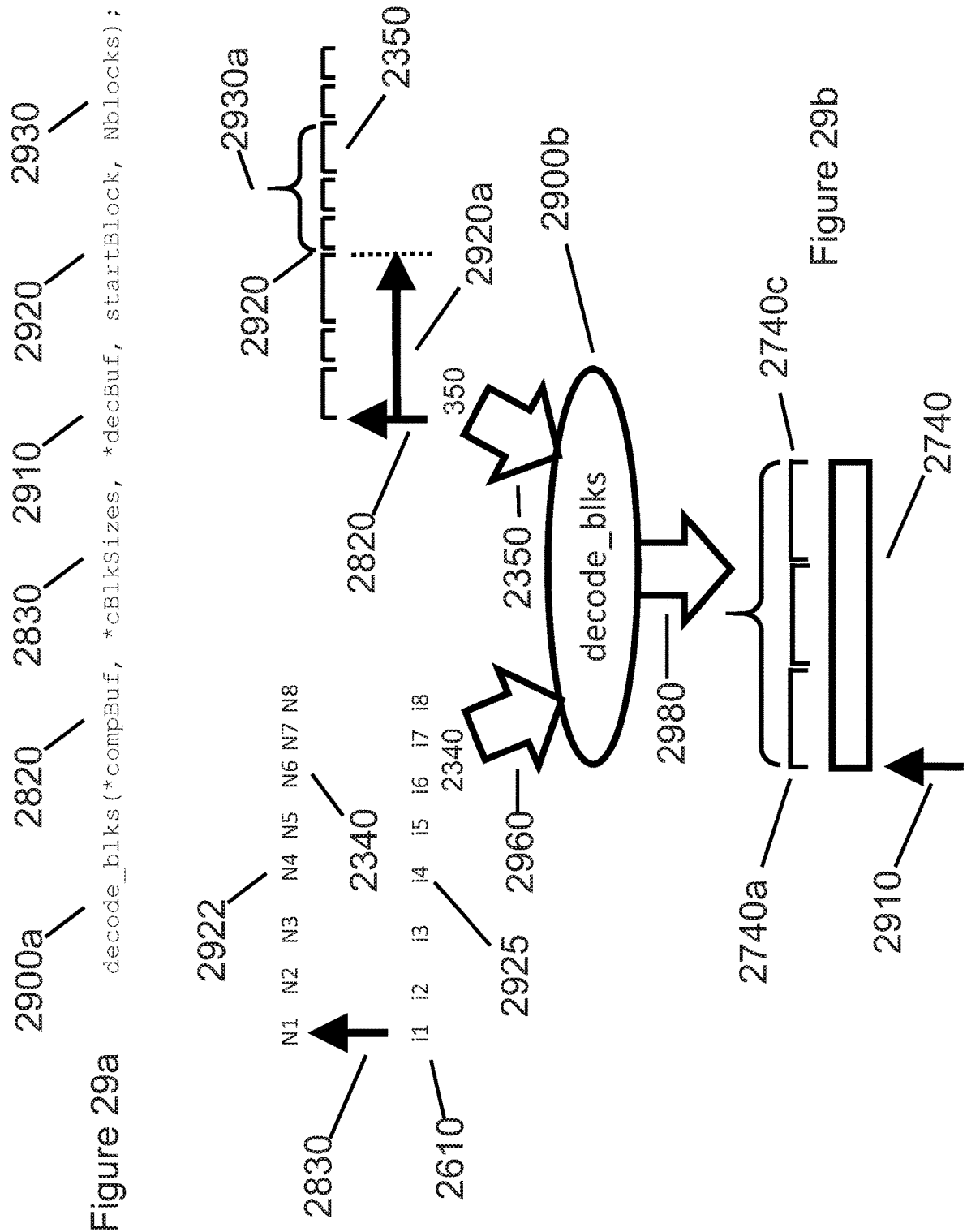

PARALLEL, BLOCK-BASED DATA ENCODING AND DECODING USING MULTIPLE COMPUTATIONAL UNITS

PRIORITY APPLICATION

This application claims the benefit of U.S. Provisional Patent Application No. 62/352,367 filed 20 Jun. 2016; which application is incorporated herein by reference.

BACKGROUND

Field

Computations by computers are increasingly being performed on rented software and hardware, instead of on purchased software and hardware. Such computations performed on rented hardware and software are often referred to as Cloud computing, where the rental period can be from seconds to months and where fees are typically based on resource usage. Presently (2016), several companies dominate the Cloud computing market, including Amazon (Amazon Web Services, or AWS), Microsoft (Azure), and Google (Google Compute Platform, or GCP). This specification refers to Cloud computing companies that rent their compute and storage infrastructure to other users as Infrastructure as a Service (Iaas) providers.

Other companies, such as Facebook. Apple, Netflix, Twitter, Instagram, and Snapchat utilize Cloud computing infrastructure both to store their customers' data (text, photos, videos, etc.) and to implement the company's dedicated service(s). This specification refers to such companies, which use Cloud computing infrastructure (compute and storage) but typically do not rent that infrastructure to other users, as App providers.

Storage requirements for Cloud data are increasing at 40% per year. At this growth rate, Cloud storage represents a significant infrastructure investment for both IaaS and App providers. Because the technology described herein reduces storage costs, it would benefit both IaaS and App providers.

Compression algorithms reduce both the storage space and storage and transfer costs for Cloud data. Historically, Lempel-Ziv-based compression (hereafter referred to as zip compression) is widely deployed in applications that desire to exploit compression's benefits. However, in Cloud computing environments, zip compression suffers from certain drawbacks, including a) the inability to modify a window size (zip's sliding window size is fixed at 32 kB) to adapt to multiple compression use cases, b) the inability to randomly access subsets of the original object's data from within a zip-compressed object, c) the inability of sliding-window compression to encode or decode in parallel, due to the inherently sequential nature of sliding-window compression, and d) the lack of compression support for "modern," common data types, such as numbers and already-compressed data, compared to the "older" common data types, such as text, for which sliding-window compression was originally developed in the 1970s. The technology described herein addresses several of sliding window compression's drawbacks listed above.

SUMMARY

Technology is described suitable for massively parallel, block-based encoding and decoding technology that includes an encoded block format. The technology described herein can use a plurality of processing cores on different blocks of a single data file concurrently to perform block-based encoding and decoding operations. The encoded block format can include a header and a payload. The encoded block format's headers for example represent unique single-Byte and multi-Byte event parameters that occur in the original data block from which each encoded block was generated. The encoded block format's payloads can represent a sequence of single-Byte and multi-Byte events using tokens that associate each event with its corresponding parameter(s). Metadata in some embodiments includes an array of encoded block sizes that support random access into the stream or group of encoded blocks that is associated with each array of encoded block sizes.

BRIEF DESCRIPTION OF THE DRAWINGS

FIG. 1a illustrates the operation of a prior art encoding method.

FIG. 1b illustrates a prior art single-Byte encoded event.

FIG. 1c illustrates a prior art multi-Byte encoded event.

FIG. 2a illustrates an input block of N input elements being divided into blocks of Nb elements.

FIG. 2b illustrates the encoding of an input block of Nb elements into the encoded block format, and the subsequent decoding of an encoded block into a regenerated block of elements.

FIG. 2c illustrates an encoded header and an encoded payload of the technology described herein.

FIG. 4a illustrates a multi-Byte sequence event of the technology described herein.

FIG. 4b illustrates a multi-Byte run event of the technology described herein.

FIG. 4c illustrates a single-Byte literal event of the technology described herein.

FIG. 5a illustrates four examples of the single-Byte and multi-Byte events.

FIG. 5b illustrates example fields of an encoded sequence event of the technology described herein.

FIG. 5c illustrates example fields of an encoded run event of the technology described herein.

FIG. 5d illustrates example fields of an encoded literal event of the technology described herein.

FIG. 5e illustrates example fields of an encoded dictionary event of the technology described herein.

FIG. 7a illustrates example fields found in a run length header.

FIG. 7b illustrates example fields found in a run value header.

FIG. 7c illustrates an example of how unique run lengths might be mapped to their corresponding tokens and token lengths.

FIG. 8a illustrates an example of the fields found in a dictionary header.

FIG. 8b illustrates an example of how unique dictionary words might be stored in a dictionary header.

FIG. 8c illustrates an example of a series of dictionary references in a dictionary event payload.

FIG. 15a illustrates an example of how a random access specifier might be converted to various block numbers, block counts, and Byte offsets.

FIG. 15b illustrates example code written in the C programming language that calculates certain variables used in FIG. 15a.

FIG. 17 illustrates example code written in the C programming language that advances a file pointer to the proper starting block for a decoder.

FIG. 18 illustrates example code written in the C programming language that controls the generation of NBytes uncompressed elements decoded from randomly accessed, encoded blocks.

FIG. 19a illustrates an example of unique literal event counts.

FIG. 19b illustrates three example token tables that might be used as tokens for the five unique literals found in FIG. 19a.

FIG. 19c illustrates how the table that minimizes the total number of bits required to represent the example literals and their counts in FIG. 19a.

FIG. 20a illustrates an example containing ten events to be encoded in a block.

FIG. 20b illustrates an example of the order in which FIG. 20a's ten example events might be sent.

FIG. 20c illustrates an alternate example of the order in which FIG. 20a's ten example events might be sent.

FIG. 22 shows a table listing block sizes for some example compression use cases.

FIG. 25a illustrates an index containing compressed block sizes and the compressed data blocks that correspond to those sizes.

FIG. 25b illustrates an example file system that manages compressed files and their corresponding list of compressed block sizes.

FIGS. 28a and 28b illustrate the Application Programming Interface and operations of the encode function.

FIGS. 29a and 29b illustrate the Application Programming Interface and operations of the decode function.

DETAILED DESCRIPTION

Figure 3:
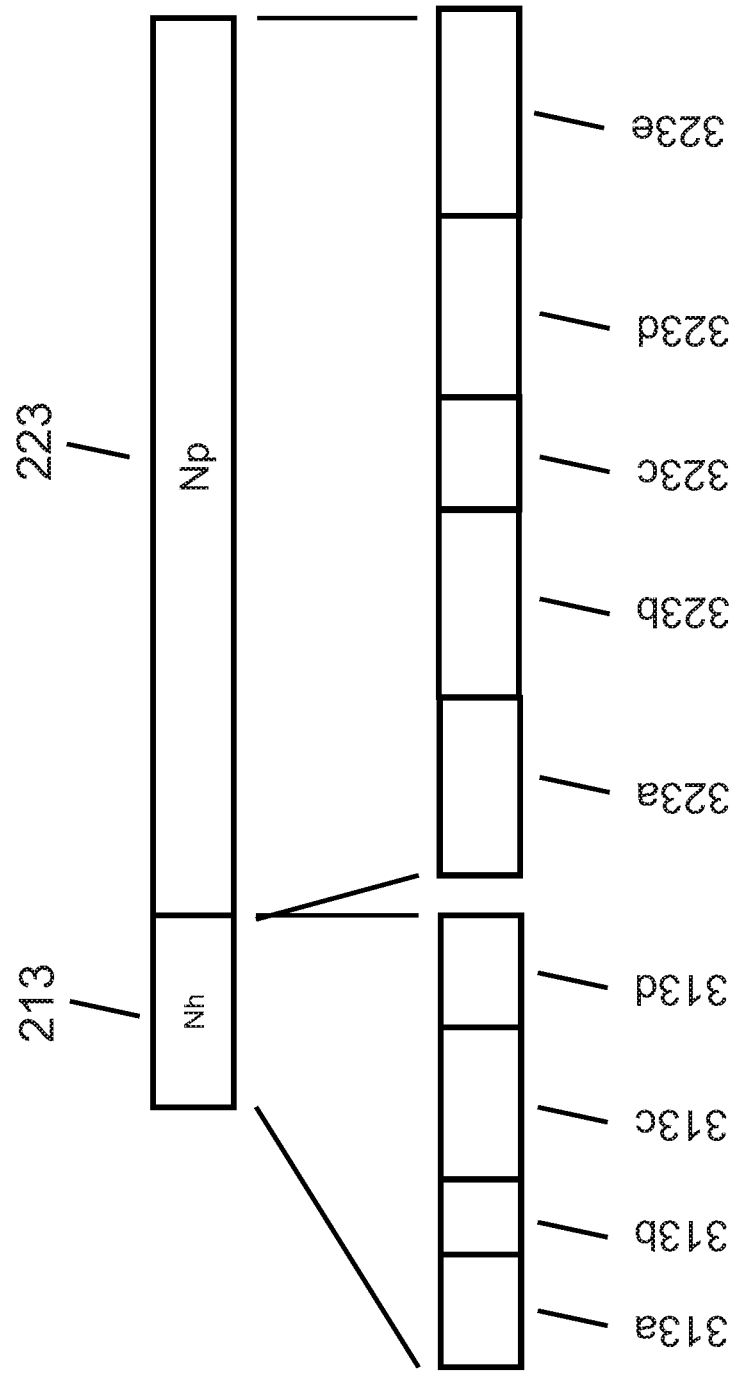
FIG. 3 illustrates the encoded block, which has a header portion and a payload portion, wherein the header portion further contains header subsets and the payload portion further contains payload subsets.

The following detailed descriptions of the technology described in this specification uses the terms "compression" and "encoding" interchangeably for lossless compression or encoding. Other compression technologies, such as those that compress audio, still images, and video, typically perform lossy compression, where the resulting decoded dataset after a lossy (encode, decode) operation is NOT identical to the original input dataset. Similarly, the following detailed descriptions of the technology described in this specification uses the terms "decompression" and "decoding" interchangeably, for the decoding of previously lossless-compressed data. The technology described in this specification applies to lossless (not lossy) compression, where the decompressed (decoded) output from this technology's decompressor (decoder) is identical to the original data input to this technology's compressor (encoder), and represented in a format that is smaller (compressed) in size than the original data.

FIG. 1a [PRIOR ART] illustrates an encoding method that uses a sliding window to encode N input elements 100. Previously viewed data buffer 110 is treated as a buffer of previously seen elements (typically Bytes, where 1 Byte=8 bits). Each Byte of N input elements 100 could represent an encoded alphabetical letter, such as 'A' or 'e' using a common encoding method, such as ASCII encoding. A buffer 120 contains one or more Bytes that are not yet encoded. An encoding algorithm (not shown in FIG. 1a) determines the longest sequence of Bytes in buffer 120 that previously occurred in previously viewed data buffer 110. In most prior art encoders, a sequence in buffer 120 must match at least 3 Bytes found in previously viewed data buffer 110. The LZ-77 sliding window encoder is an example implementation of the prior art encoder illustrated in FIG. 1a.

Prior Art sliding window encoders typically distinguish between just two kinds of events: single-Byte events (which are expanded by 1 bit per single-Byte event), and multi-Byte events (which are compressed). Multi-Byte events generated by prior art sliding window encoders must match 3 or more elements in previously viewed data buffer 110.

FIG. 1b [PRIOR ART] illustrates an example single-Byte event, with prefix 120a (a '0' bit) and suffix 120b (typically the original 8-bit Byte being represented).

FIG. 1c [PRIOR ART] illustrates an example multi-Byte event with prefix 120c (a '1' bit), a distance field 120d, and a length field 120e. Distance field 120d specifies how far back in previously viewed data buffer 110 the example sequence begins. Length field 120e represents the number of elements (typically Bytes) to copy in order to regenerate the sequence found at that position in buffer 120.

The encoded block format of the technology described herein, encoders that generate the encoded block format described herein, and decoders that decode the encoded block format described herein may overcome some of the drawbacks of prior art sliding window encoders and decoders.

In general, an encoding technology is described that includes a method comprising reading from a non-transitory memory or from a communication channel, a plurality of data blocks of block size N of the input data set; using a plurality of cores, encoding data blocks of the input data set into a plurality of encoded data blocks of variant block sizes of N or less, including concurrently encoding a first data block of the plurality of data blocks of the input dataset into a first losslessly encoded data block using a first core in the plurality of cores, and a second data block of the plurality of data blocks of the input dataset into a second losslessly encoded data block using a second core in the plurality of cores. Also, computer system and computer program product technologies implementing logic to perform the encoding method are described.

Also, a complementary decoding technology is described that reading from a non-transitory memory or from a communication channel, a plurality of encoded data blocks of variant block sizes of N or less of the encoded data set; using a plurality of cores, decoding data blocks of the encoded data set into a plurality of decoded data blocks of size of N, including concurrently decoding a first data block of the plurality of encoded data blocks into a first decoded data block using a first core in the plurality of cores, and a second data block of the plurality of encoded data blocks into a second decoded data block using a second core in the plurality of cores. Also, computer system and computer program product technologies implementing logic to perform the decoding method are described.

FIG. 2a illustrates how the technology described herein first separates N input elements 100 (intended to represent the same N input elements 100 as in FIG. 1a) into blocks of Nb elements 215a . . . 215z. In a preferred embodiment, Nb for 215a, 215b, . . . 215z are identical, except that in the general case, the final block size 215z may contain fewer than Nb elements. For the remainder of this patent application, concatenated Block 1 210, Block 2 220, Block 3 230, etc. to final block 290 together contain all N input elements 100. In FIG. 2a, element count 215a=element count 215b=Nb. Element counts 215 represent the number of elements (typically Bytes) in Block 210, Block 220, etc., respectively.

FIG. 2b illustrates how an encoder 212 encodes example Block 210 into encoded header 213a and encoded payload 223a, which represent the elements in Block 210 using fewer bits. Also shown in FIG. 2b, a decoder 262 decodes encoded header 213a and encoded payload 223a and re-creates decoded output block 290. Since the process of converting example Block 210 into encoded header 213a and encoded payload 223a and then decoding encoded header 213a and encoded payload 223a into decoded output block 290 is lossless, decoded output block 290 contains Nd=Nb elements that are identical to the Nb elements in Block 210.

FIG. 2c illustrates the general structure of each output block of the technology described herein, which contains encoded header 213 and encoded payload 223. Without diverging from the intent of this patent application, encoded header 213 and encoded payload 223 can be transmitted or stored in any order. Similarly, the various subsets of encoded header 213 and encoded payload 223 (further described in FIG. 3) can be stored or transmitted in any order, without diverging from the intent of this patent application.

FIG. 3 further details that encoded header 213 contains encoded header element 313a, encoded header element 213b, etc. Similarly, FIG. 3 illustrates that encoded payload 223 contains encoded payload element 323a, encoded payload element 323b, etc. The number of encoded header elements 313 and encoded payload elements 323 need not be equal, since some types of encoding events (examples of such encoding events are provided in FIGS. 4-9) do not require corresponding header information, and some encoded header elements 313 may contain parameters or information that pertains to two or more encoded payload elements 323.

FIG. 4 provides examples (in FIGS. 4a and 4b) of two multi-Byte events and (in FIG. 4c) of a single-Byte event. FIG. 4a illustrates a sequence (SEQ) event 410. The technology described herein represents the second sequence in sequence event pair 410 using three fields: a sequence event indicator 412, a sequence length 414 and a sequence distance 416. The way that the technology described herein encodes (length, distance) parameters differs from how prior art compressors represent sequence events. In the example shown in FIG. 4a, the second occurrence of the length-5 (five Bytes) string 'Fred_' (where '_' represents a space) is replaced by the three sequence event fields 412, 414, and 416. Sequence event indicator 412 is usually encoded using 1 or 2 bits, while sequence length 414 might be encoded using 2 to 6 bits in sequence length token 514. Similarly, sequence distance 416 is encoded in sequence distance field 516 using $\log_2$(sequence location). The sum of the bits in fields 412, 514, and 5416 is always smaller than Nlen×8 bits, where Nlen is the sequence length 414, so the encoded representation of sequence event 410 (which is the concatenation of bits in 412, 514, and 516) occupies fewer bits than sequence event 410 did.

FIG. 4b illustrates a run event 420 that the technology described herein represents using three fields: a run event indicator 422, a run length 424, and a run value 426. In the example shown in FIG. 4b, run event 420 contains eight 'z' letters in a row—a "run" of 8 z's. Run events consist of run event indicator 422, run length 424, and run value 426. As with sequence event 410, run event 420 contains Rlen Bytes (run length 424×8 bits per Byte), and the concatenation of elements 422, run length token 524, and run value token 526 occupies less bits that original run 420 did.

FIG. 4c illustrates an example of a single-Byte literal event 430 that contains the single Byte 'P.' The technology described herein represents single-Byte literals using literal event indicator 432 followed by literal value 434.

In the three examples provided in FIG. 4, we note that certain event parameters, such as sequence lengths 414, run lengths 424, and literal values 434 take on values that are unique from block to block. For example, Block 210 in FIG. 2*a* may contain sequences having sequence lengths 414 of {2, 3, 5, 6, 14, 23, and 31} Bytes, while Block 220 in FIG. 2*a* may contain sequence lengths 414 of {2, 3, 4, 5, 8, 9, 10, 15, and 20} Bytes. Similarly, Block 210 may contain runs having run values 426 {'e', '5', and '.'}, while Block 220 may contain runs having run values 426 of {'e', '.', 't', and 's'}.

As part of the encoding process of the technology described herein, encoder 212 gathers and counts the unique events and parameters that are found in each block and encodes those unique events and parameters in one or more encoded header elements 313. Encoded payload elements 323 then describe events in that block using tokens and token lengths from each corresponding header that specify which of the unique elements described in the corresponding event's header occur at the location or locations where each event occurred in that block.

FIG. 5 provides additional details about the fields that comprise sequence events 410, run events 420, literal events 430, and dictionary events 440. Specifically, FIG. 5 provides examples of how certain parameters (such as sequence length 414 or run value 426) are replaced with corresponding, unique tokens (such as sequence length token 514 or run value token 526).

FIG. 5*b* and the five columns of FIG. 5*a* illustrate that sequence event bits 510:
   a) Are multi-Byte events (length>1 Byte),
   b) Contain 3 fields,
   c) Field 1 contains the sequence event token 512 that uses the two bits '00',
   d) Field 2 contains the sequence length token bits 514 that represent sequence length 414,
   e) Field 3 contains the sequence distance bits 516 that represent sequence distance 416.

FIG. 5*c* and the five columns of FIG. 5*a* illustrate that run event bits 520:
   a) Are multi-Byte events (length>1 Byte),
   b) Contain 3 fields,
   c) Field 1 contains the run event token 522 that uses the two bits '01'
   d) Field 2 contains the run length token 524 that represent run length 424,
   e) Field 3 contains the run value token 526 that represent run value 426.

FIG. 5*d* and the five columns of FIG. 5*a* illustrate that literal event bits 530:
   a) Are single-Byte events (length=1 Byte),
   b) Contain 2 fields,
   c) Field 1 contains the literal event token 532 that uses the two bits '10',
   d) Field 2 contains literal value token 534 that represents literal value 434.

FIG. 5*e* and the five columns of FIG. 5*a* illustrate that dictionary event bits 540:
   a) Are multi-Byte events (length>1 Byte),
   b) Contain 2 fields,
   c) Field 1 contains the dictionary event token 542 that uses the two bits '11',
   d) Field 2 contains wordID token 544.

FIGS. 6-9 provide examples of how various lengths and values (such as sequence length token 414 and literal value token 434) are mapped to unique representations called tokens (such as sequence length token 514 and literal value token 534). The technology described herein provides a mechanism using certain bits in header fields 313 whereby the encoder 212 signals to the decoder 262 such specific mappings between (for example) {lengths, values} and {length field tokens, value field tokens}.

Those familiar with compression will recognize that such parameter-to-token mappings are often performed to reduce the number of bits required to assign a fixed number of parameters (also signaled in block header 313) to specific tokens of varying width, such as the Huffman codes that are well-known to those familiar with compression techniques. In general, the mappings used by the technology described herein assign shorter codes to frequently occurring parameters, and longer codes to less common parameters. By doing so, frequently occurring sequence lengths 410*b* and literal values 430*b* are assigned to sequence length fields 510 and literal value fields 530 whose field length is inversely proportional to the (length and value's) frequency of occurrence. Commonly occurring parameters use shorter codes, while less frequent parameters use longer codes.

Figures 6A, 6B:
FIG. 6a illustrates example fields found in a sequence event header.
FIG. 6b illustrates an example of how unique sequence lengths might be mapped to their corresponding tokens and token lengths.
Figure 6C:
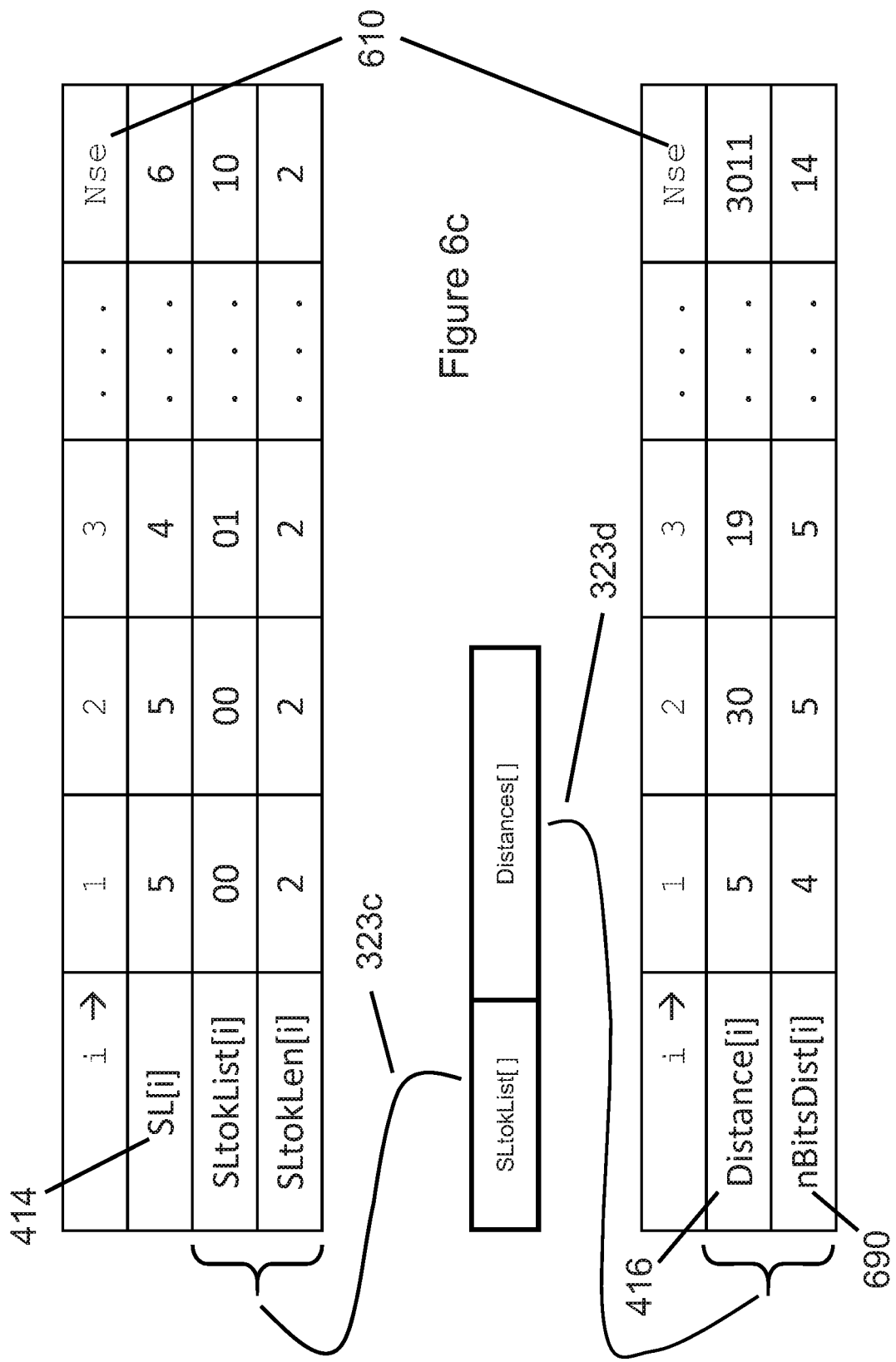
FIG. 6c illustrates an example of a series of sequence length tokens and sequence distances might be mapped into a sequence event payload.

FIGS. 6*a*, 6*b*, and 6*c* together illustrate examples of how example sequence event header 313*b* (in FIG. 6*a*) is used by the technology described herein to define the sequence parameters used in sequence length payload 323*c* (in FIG. 6*c*) and sequence distance payload 323*d* (in FIG. 6*c*).

FIG. 6*a* illustrates an example of sequence event header 313*b* that contains five fields:
  1. Nse: the number of sequence events 610 that appear in sequence length payload 323*c* and sequence distance payload 323*d*. Note that since every sequence event contains a (length, distance) pair that signals sequence length 414 and sequence distance 416 via sequence length token 514 and sequence distance field 516. Thus in FIG. 6*c*, the number of sequence length fields 610 in sequence length payload 323*c* and the number of sequence distance fields 610 in sequence distance payload 323*d* is identical. The number of bits in sequence length payload 323*c* and the number of bits in sequence distance payload 323*d* are not necessarily the same, since the mapping of sequence lengths 414 to sequence length tokens 514 likely differs from the mapping of sequence distances 416 to sequence distance fields 516. Similarly, the number of unique sequence lengths 620 is typically unrelated to the distance 416 where the previous sequence occurred.
  2. NuSL: the number of unique sequence lengths 620 used in sequence length payload 323*c*. Note that the number of unique sequence lengths is a characteristic of a particular input block 210, 220, 230, etc. and typically varies from block to block.
  3. Nbits: the number of bits 630 used by each entry in the array of unique sequence lengths 640.
  4. SLu[ ]: an array of unique sequence lengths 640, each of which occupies Nbits 630 bits. In a preferred embodiment, elements of the array of unique sequence lengths 640 are listed in decreasing frequency order. Thus the first entry in unique sequence length array 640 is the most frequently occurring sequence length in the current block, and the last entry in unique sequence length array 640 is the least common sequence length in the current block.
  5. SLtok_tableNum: a sequence length mapping identifier 650 that maps each unique sequence length array value 640 to a specific (predetermined) {token, token length} pair, selected from a predetermined number of token tables.

FIG. 6*b* provides an example of how unique sequence length army 640 is mapped via mapping identifier 650 to a particular list of {sequence length token 660, sequence length token length 670} pairs. FIG. 6*b* illustrates that this example contains unique sequence length array 640 (SL[i]) contains NuSL number of unique sequence lengths 620. In the example in FIG. 6b, sequence lengths 5, 4, and 6 occur frequently (and are thus assigned sequence length tokens 660 '00', '01', and '10' respectively, each having token lengths 670 of 2 bits), while sequence length 53 is rare, perhaps occurring just once in input block 210. Because sequence length 53 is rare, it is assigned a token '11001' having a token length 670 of 5 bits. Thus in this example, common sequence lengths are assigned short tokens of 2 bits, while rare sequence lengths are assigned longer tokens of 5 bits.

Encoder 212 selects from among multiple, predetermined tables of {token 660, token length 670} pairs, based on the table that minimizes the number of bits required to represent the number of sequence events 610 encoded in sequence length payload 323c, as further described in FIG. 19.

By providing both unique sequence length array 640 and mapping identifier 650, sequence length header 313b is able to signal to decoder 262 the mapping between each entry of unique sequence length array 640 and its corresponding (token 660, token length 670) pair. Because encoder 212 selects from among a limited number of mapping tables (frequencies of occurrence of unique multi-Byte and single-Byte parameters), encoder 212 is also able to re-use mapping identifiers 650 for all parameters (sequence lengths 410b, run values 420c, literal values 420c, etc.). Thus mapping identifier 650 described with FIG. 6 will be re-used again in the following discussions related to FIGS. 7, 8, and 9. Although the parameters being encoded vary from figure to figure, the "shapes" are chosen by encoder 212 to match the "shape" (distribution) of each parameter being encoded, chosen from among a limited number of available mapping "shapes."

Once example sequence header 313b has signaled the five parameters of sequence events 410 described in FIG. 6a, FIG. 6c illustrates how encoder 212 maps sequence lengths 680 (of which there are Nse number of sequence events 610) to their corresponding {token 660, token length 670} pair. Given the mapping between unique sequence length array 640 and its corresponding (token 660, token length 670), encoder 212 performs the following three steps for each of Nse 610 sequence lengths in sequence length array 410b:

a) Fetch the current sequence length 414 SL[i],
b) Map the current sequence length 414 SL[i] to its corresponding, unique {token 660, token length 670} from FIG. 6b,
c) Pack the current sequence length's unique {token 650, token length 670} from FIG. 6b into sequence length payload 323c.

In the example shown in FIGS. 6b and 6c, note that unique sequence lengths {4, 5, 6} are always mapped to the tokens {01, 00, 10} that use {2, 2, 2} bits as their token length. This mapping was defined for all unique sequence lengths in the block, as shown in FIG. 6b.

FIG. 6c also illustrates an example of how Nse unique sequence distances 610 are encoded into sequence distance payload 323d. Because the length of all sequence events is known after decoder 262 has decoded sequence length payload 323c, the starting location of each sequence is also known, so the number of bits per distance parameter 690 is also known.

For example, with Nb=4096 (4096 Bytes per Block 210, 220, etc.), sequence events 410 that begin at Byte offsets 0 . . . 15, by definition, have distances that will fit into 4 bits, because ceil(log$_2$[15])=4. In other words, each sequence's distance cannot be larger than the location in the block where the sequence begins: if a sequence begins at location 597, there are only 596 possible locations where the previous (matching) sequence can begin, so the distance for that sequence will implicitly be encoded using log 2(597)=10 bits.

In a similar manner, sequence events that begin at Byte offsets 1024 . . . 2047, will use 11-bit distances, because ceil(log$_2$[2047])=11. Thus the sequence distance payload implicitly encodes the number of bits per distance parameter 690, because both encoder 212 and decoder 262 are aware of the starting location of each sequence event. FIG. 6c illustrates the implicit mapping of sequence distances 410c and the number of bits per sequence distance 690 as the distance bits in this example are packed into distance payload 323d.

Figure 7D:
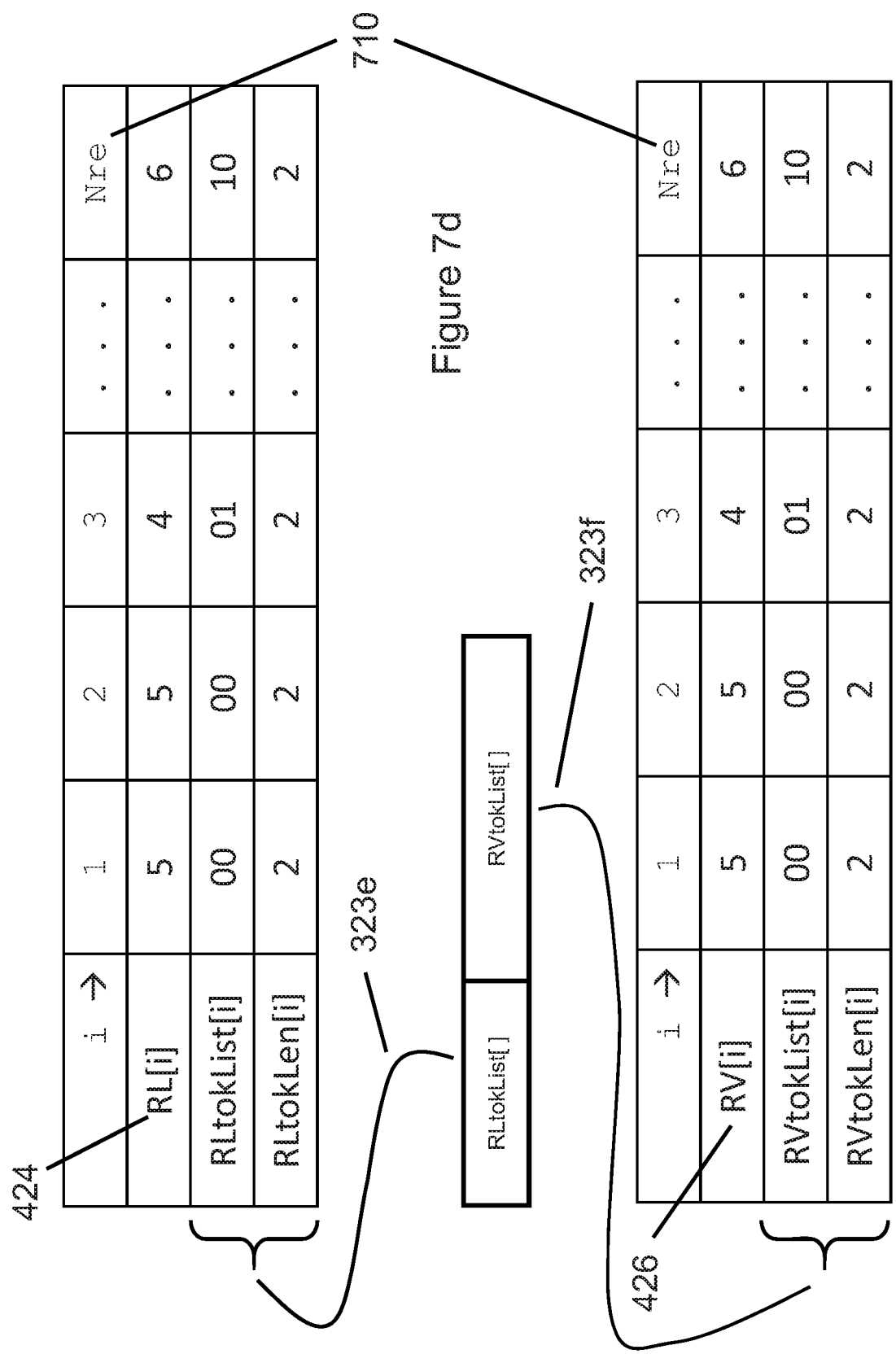
FIG. 7d illustrates an example of a series of run length tokens and run value tokens might be mapped into a run event payload.

FIGS. 7a thru 7d provide an example of how the technology described herein encodes run events 420. In a manner analogous to that described in FIG. 6a, FIG. 7a provides an example in which run event header 313c contains the following five fields:

1. Nre: the number of run events 710 represented in FIG. 7d's run length payload 323e and run value payload 323f. As previously described in FIG. 4b, every run event is described using a (length, value) pair that specifies run length 410b and run value 420c via run length tokens 524 and run value tokens 526 (FIG. 5c). Thus in FIG. 7d, the number of run length tokens 524 in run length payload 323e and the number of run value tokens 526 in sequence distance payload 323f are identical to Nre number of run events 710. The number of bits in run length payload 323e and the number of bits in run value payload 323f are not necessarily the same, since the mapping of run lengths 424 to run length tokens 524 likely differs from the mapping of run values 426 to run value tokens 526. Similarly, the number of unique run lengths 720 (FIG. 7a) is typically unrelated to the number of unique run values 760 (FIG. 7b).
2. NuRL: the number of unique run lengths 720 appearing in run length payload 323e. Note that the number of unique run lengths is a characteristic of a particular input block 210, 220, 230, etc. and typically varies from block to block.
3. Nbits: the number of bits 730 used by each run length entry in the array of unique run lengths 740, RLu[ ].
4. RLu[ ]: an array of unique run lengths 740, each of which occupies Nbits 730 bits. In a preferred embodiment, elements of the array of unique run lengths 740 are listed in decreasing frequency order. Thus the first entry in unique run length array 740 is the most frequently occurring run length in the current block, and the last entry in unique run length array 740 is the least common run length in the current block.
5. RLtok_tableNum: a run length mapping identifier 750 that maps each unique run length 740 to a specific (predetermined) {run length token 790, run length token length 795} pair, selected from a predetermined number of tables.

FIG. 7b shows an example run value header 313d that contains three fields:

1. NuRV: the number of unique run values 760 occurring in run value payload 323f. Note that the number of unique run values is a characteristic of a particular input block 210, 220, 230, etc. and typically varies from block to block.
2. RVi[ ]: an array of unique run values 770, each of which occupies 8 bits, because all run values are Bytes in the range 0 . . . 255. In a preferred embodiment, elements of the array of unique run values 770 are listed in decreasing frequency order. Thus the first entry in unique run value array 770 is the most frequently occurring run value in the current block, and the last entry in unique run value array 770 is the least frequently occurring run value in the current block.

3. RVtok_tableNum: a mapping identifier 780 that maps the distribution of unique run value array values 770 to a specific (predetermined) {token, token length} pair, selected from a predetermined number of tables.

FIG. 7c provides an example of how unique run length array 740 could be mapped via run length mapping identifier 750 to a particular list of {token 790, token length 795} pairs. FIG. 7c illustrates that unique run length array 740 (RL[i]) contains NuRL number of unique run lengths 720. In the example in FIG. 7c, run lengths 3, 2, and 4 occur frequently and are thus assigned sequence length tokens 790 having token lengths 795 of 2 bits. In contrast, run length 22 is rare, perhaps occurring just once in the current block. Thus the rare run length with value 22 is assigned a token '11001' having a token length 795 of 5 bits.

In a manner similar to that previously used with FIG. 6c, FIG. 7d illustrates how run lengths 424 are mapped using the {token 790, token length 795} to the run length tokens 790 that are packed into run length payload 323e. Similarly, FIG. 7d also illustrates how run value tokens 526 are mapped to tokens (not shown in FIG. 7) representing run value 426. These tokens 526 are packed into run value payload 323f.

FIG. 8 illustrates another type of multi-Byte event called a dictionary event. Dictionary events are repeated, frequently occurring multi-Byte events ("words") in the current block. As shown in FIG. 8c, dictionary words 830 are represented with their corresponding word ID 444. By using dictionary encoding, the encoded block format achieves significant compression when input blocks contains repeated multi-Byte events. In FIG. 8a, dictionary header 313g contains three fields:

1. Nde: the number of dictionary events 810 in the current block,
2. NuDict: the number of unique dictionary words 820 in the current block,
3. dictWord[NuDict]: an array of unique dictionary words 830, where each character of each dictionary word occupies 8 bits, since all dictionary words are composed of Bytes in the range 0 . . . 255. In a preferred embodiment, words of dictWord array 830 are listed in decreasing frequency order. Thus the first unique dictionary word 830 is the most frequently occurring multi-Byte dictionary word in the current block, and the last entry in dictWord array 830 is the least common multi-Byte dictionary word in the current block.

FIG. 8b illustrates an example array of unique dictionary words 830, where the first word is 'and' (3 letters), the second dictionary word is 'the' (3 letters), the third word is 'Fred' (4 letters), and the final Ndict 820'th word is 'quirky' (6 letters). The wordID 444 corresponding to each dictionary word 830 is also shown in FIG. 8b.

FIG. 8c illustrates an example word list 840 containing Nde dictionary events 810, and the replacement of each word list 840 event with its corresponding dictionary word ID 850. For instance, the first and third words on word list 440 are 'the', so the first and third words are represented by word ID 444=2, since (as previously described with FIG. 2) unique dictionary word 'the' has word ID 444=2.

Figures 9A, 9B:
FIG. 9a illustrates example fields found in a literals event header.
FIG. 9b illustrates an example of how unique single-Byte literals might be mapped to their corresponding tokens and token lengths.
Figure 9C:
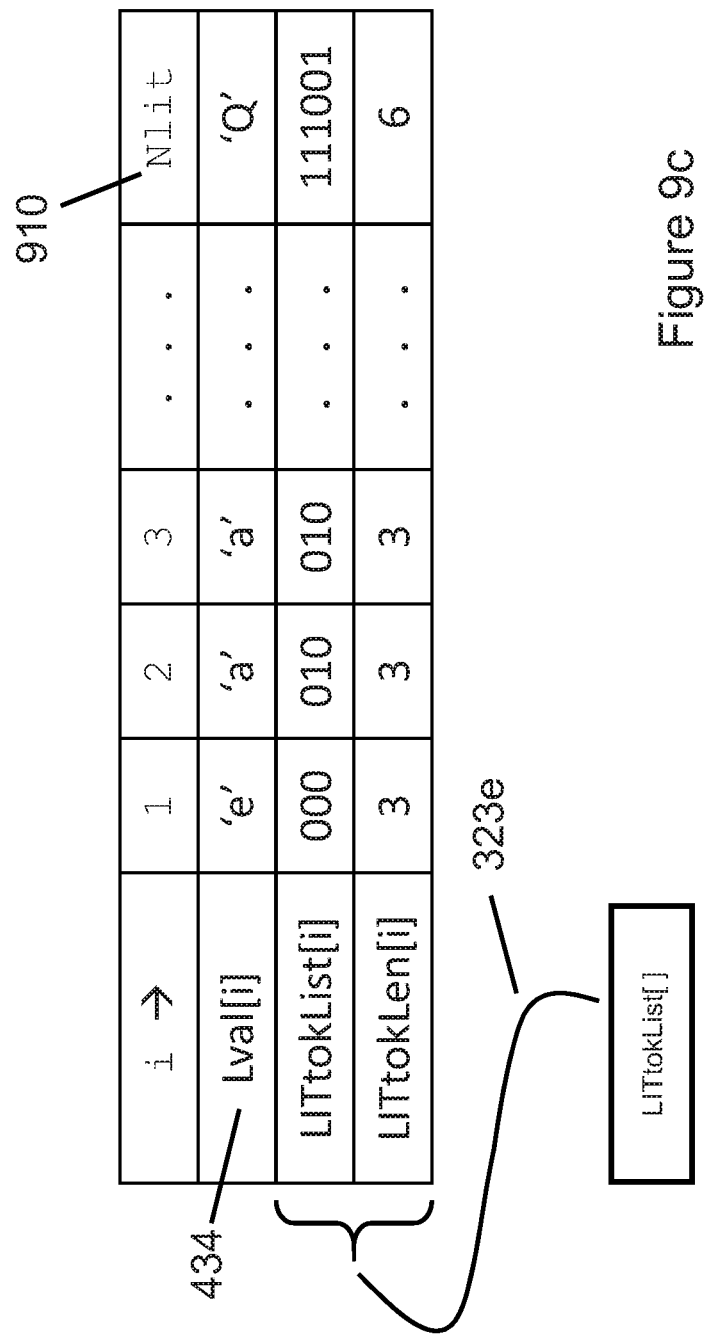
FIG. 9c illustrates an example of how a series of literal events might be mapped to literal tokens and token lengths.

FIGS. 9a, 9b, and 9c illustrate how the technology described herein combines literal event header 313e with literal event payload 323e to represent all literal (single-Byte) events in a block. In FIG. 9a, dictionary header 313e contains four fields:

1. Nlit: the number of literal (single-Byte) events 910 in the current block.
2. NuL: the number of unique literals 920 in the current block.
3. uLit[NuL]: an array of unique literals array 930, where each literal occupies 8 bits. In a preferred embodiment, literals in uLit array 930 are listed in decreasing frequency order.
4. LIT_tableNum: a literals mapping identifier 940 that maps each entry of unique literals array 930 to a specific (predetermined) {literals token 960, literals token length 970} pair, selected from a predetermined number of tables.

FIG. 9b illustrates an example mapping between the entries of unique literals array 940 and the {literals token 960, literals token length 970} pairs contained in the table specified by LIT_tableNum mapping identifier 940.

In a manner similar to that previously used with the description of FIG. 7d, FIG. 9c illustrates how literals entries 950 are mapped using the {literals token 960, literals token length 970} pairs 940 to the bits that are packed into literals payload 323e. For example, the second and third literal entries 950 representing the literal 'a' (in FIG. 9b) is replaced with {literals token 960, literals token length 970}={'010', 3} from FIG. 9b. Similarly, the last literal entry 950, LVal[Nlit], is 'Q', so the literal 'Q' is replaced with {literals token 960, literals token length 970}={'111011', 6} from FIG. 9b.

FIGS. 6a, 7a, 8a, and 9a illustrate examples of how the technology described herein represents unique single-Byte or multi-Byte parameters.

Figure 10:
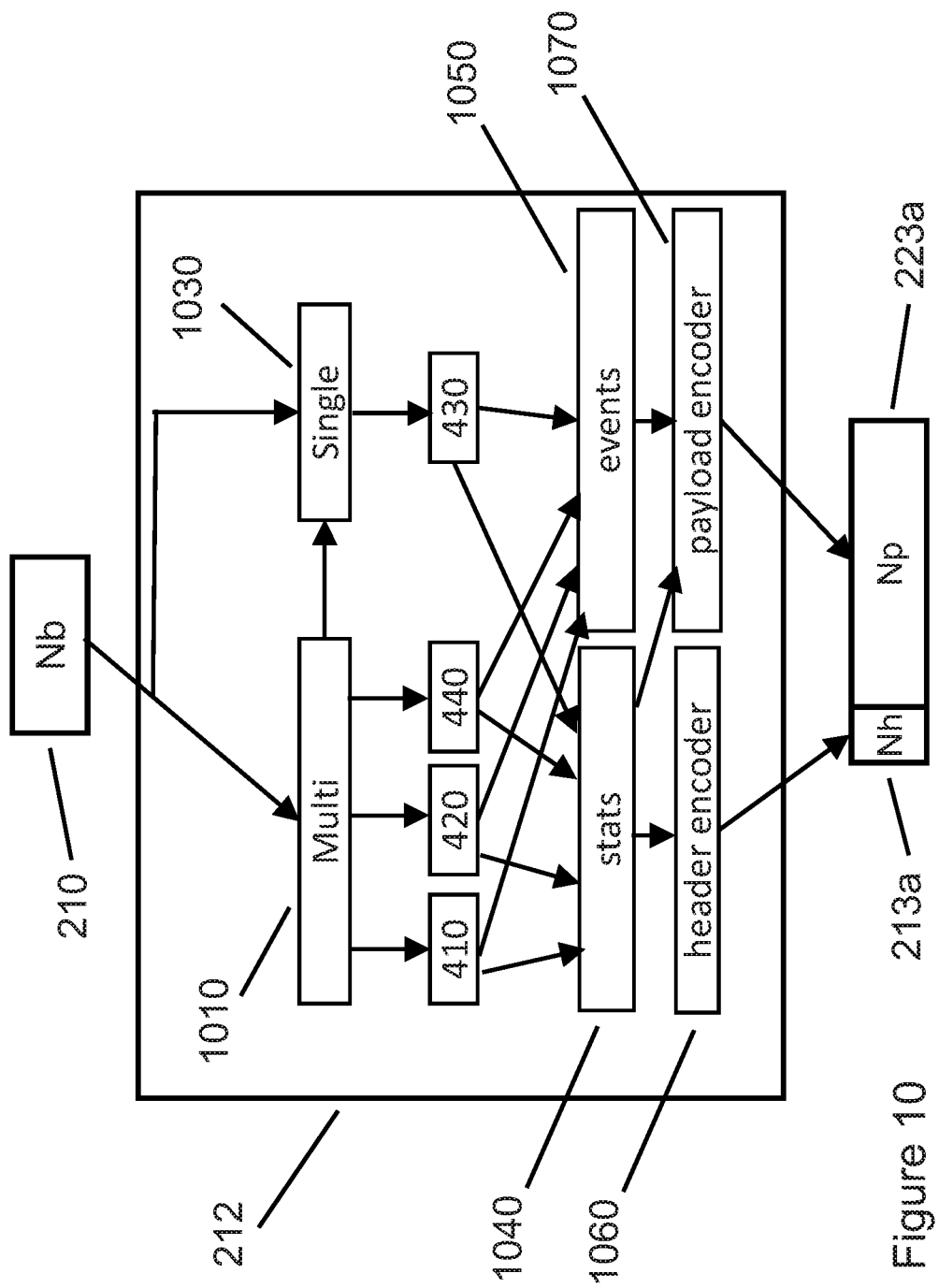
FIG. 10 illustrates an example of an encoder that encodes and input block of Nb elements into an encoded block with a header portion and a payload portion of the technology described herein.

FIG. 10 illustrates an example encoder 212 that generates the encoded block format. Input block 210 is input to encoder 212, which outputs encoded header 213a and encoded payload 223a. Encoder 212 first scans all elements of input block 210 using multi-Byte detector block 1010, which identifies zero or more multi-Byte events in the block. Examples of multi-Byte events are sequence event 410, run event 420, and dictionary event 440. After all multi-Byte events are identified, a single-Byte event identifier 1030 identifies any remaining single Bytes not belonging to a multi-Byte event. All multi-Byte events and single-Byte events are then submitted to statistics block 1040, which identifies the unique multi-Byte parameters, such as unique sequence lengths 414, unique run lengths 424, etc., and the unique literals 434, as well as calculating various counts, such as the number of multi-Byte and single-Byte events, the number of unique parameters for multi-Byte and single-Byte events, etc.

As previously described in FIGS. 6-9, values describing unique parameters and their corresponding tokens are then combined by header encoder 1060, which, in a preferred embodiment, concatenates all headers 213. Similarly, multi-Byte and single-Byte events are encoded sequentially by combining the output of event list generator 1050 and the output of statistics block 1040. Header encoder 1060 generates the encoded header 213a, while payload encoder 1070 generates encoded payload 223a, which are combined to create an encoded block of the technology described herein.

Figure 11:
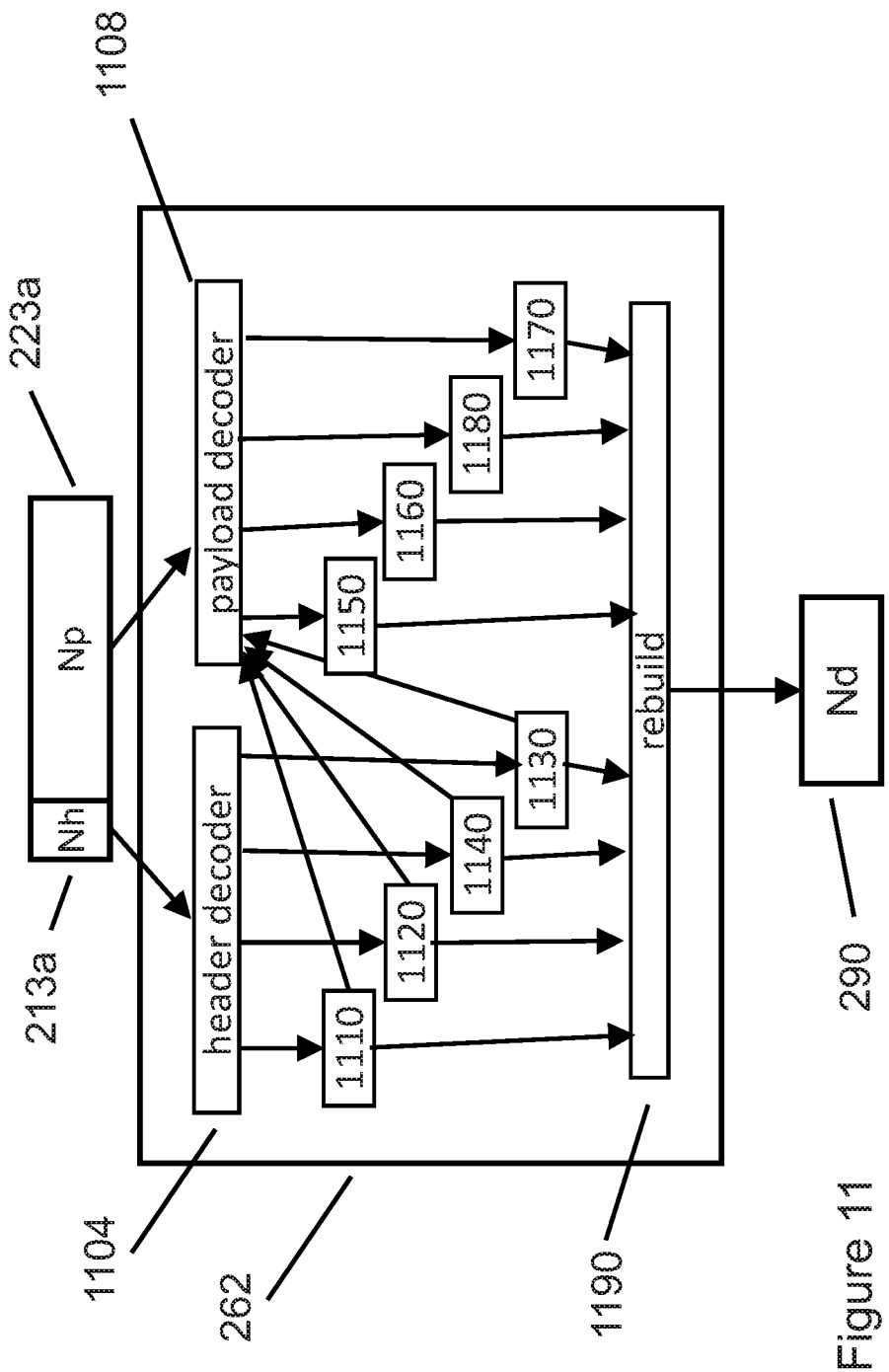
FIG. 11 illustrates an example of a decoder that regenerates a decoded block of elements from an encoded block with a header portion and a payload portion of the technology described herein.

FIG. 11 illustrates how decoder 262 decodes example encoded header 213a and example encoded payload 223a, generating a decoded block 290. Header decoder 1104 decodes each of the header fields in encoded header 213a, which in the example of FIG. 11 consist of multi-Byte header A 1110, multi-Byte header B 1120, single-Byte header C 1140, and multi-Byte header D 1130. Payload decoder 1108 decodes each of the payload fields in encoded payload 223a, which consist (in the example of FIG. 11) of multi-Byte Payload A 1150, multi-Byte payload B 1160, single-Byte payload C 1180, and multi-Byte Payload D 1170. Payload decoder 1108 uses the decoded header fields 1110, 1120, 1140, and 11320 to decode the respective payloads 1150, 1160, 1180, and 1170. Rebuild block 1190 combines the unique parameters from decoded headers 1110, 1120, 1140, and 1130 and the decoded payloads 1150, 1160, 1180, and 1170 to create decoded block 290.

Figure 12:
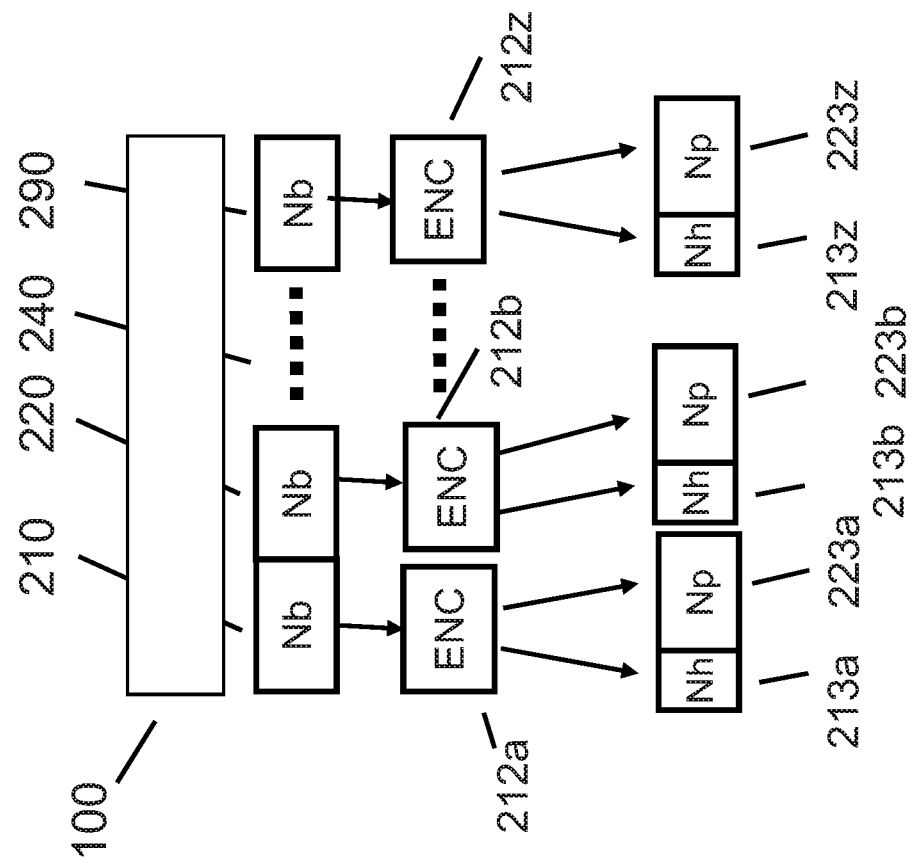
FIG. 12 illustrates how multiple, independent encoders can simultaneously generate a series of encoded blocks.

FIG. 12 illustrates how a plurality of simultaneously (concurrently) operating encoders 212a thru 212z encode the elements of input array 100, which is divided into a plurality of input blocks 210, 220, 240, etc., where in a preferred embodiment, each input block to encoders 212a thru 212z encoded an equal number of elements. Encoder 212a generates encoded block header 213a and encoded block payload 223a, while encoder 212b generates encoded block header 213b and encoded block payload 223b, and so on. Using Nx simultaneous encoders (Nx is not shown in FIG. 12), the encoding of input array 100 will operate Nx times faster than a single encoder 212 could encode input array 100. The Nx simultaneous encoders could be implemented using simultaneous (concurrent) software threads or simultaneous (concurrent) hardware blocks.

In many data centers, servers are not fully loaded (utilized), and thus concurrent software threads are usually available. Thus multiple encoded blocks of the technology described herein can be encoded by multiple encoders to accelerate the encoding of input array 100. Similarly, multiple hardware blocks conforming to encoder 212 described in FIG. 10 could be instantiated in a system-on-chip (SoC) or application-specific integrated circuit (ASIC) to accelerate the hardware encoding of elements of input array 100.

Encoders 212 are what is known to those skilled in the art of distributed processing as "embarrassingly parallel," meaning that if Nx times more processors (software threads or hardware instantiations) are available, the compression method of the technology described herein will operate Nx faster than if just one encoder 212 were used. The linear relationship between the number of processors Nx and the resulting speed-up Nx defines the term "embarrassingly parallel."

Figure 13:
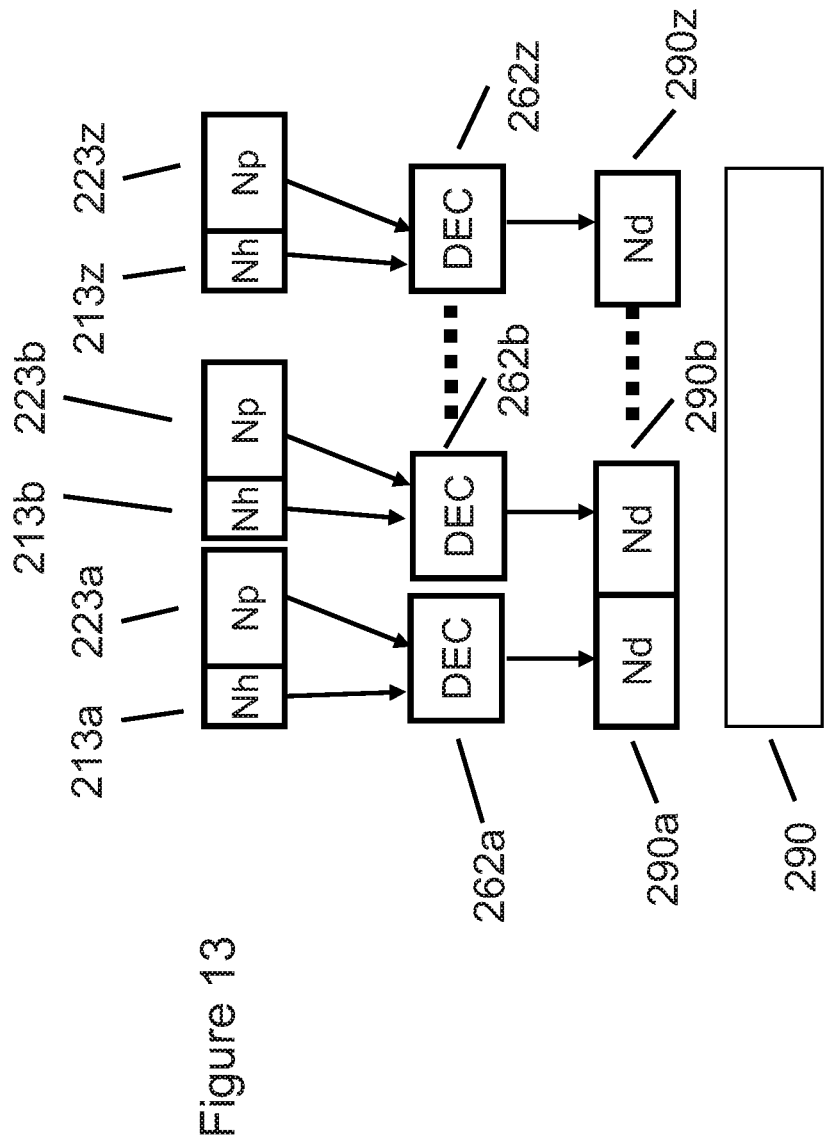
FIG. 13 illustrates how multiple, independent decoders can simultaneously generate a series of decoded blocks.

FIG. 13 illustrates how a plurality of simultaneously (concurrently) operating decoders 262a thru 262z decode a plurality of {encoded headers 213, encoded payloads 223} blocks, regenerating a plurality of decoded blocks 290a thru 290z in the example shown in FIG. 13. Decoded blocks 290a thru 290z are typically concatenated to create final decoded output array 290.

In many data centers, servers are not fully loaded (utilized), and thus concurrent software threads are usually available. Thus multiple encoded blocks {213a, 223a}, {213b, 223b}, etc., of the technology described herein can be decoded by multiple decoders 262 to generate a plurality of decoded blocks 290a thru 290z. Similarly, multiple hardware blocks conforming to decoder 262 described in FIG. 11 could be instantiated in a system-on-chip (SoC) or application-specific integrated circuit (ASIC) to accelerate the hardware decoding of elements of the plurality of encoded blocks {213, 223}.

The decoders are what is known to those skilled in the art of distributed processing as "embarrassingly parallel," meaning that if Nx times more processors (software threads or hardware instantiations) are available for decoding, the decompression method of the technology described herein will operate Nx faster than if just one decoder 262 were used. The linear relationship between the number of processors Nx and the resulting speed-up Nx is what defines the term "embarrassingly parallel."

Figure 14:
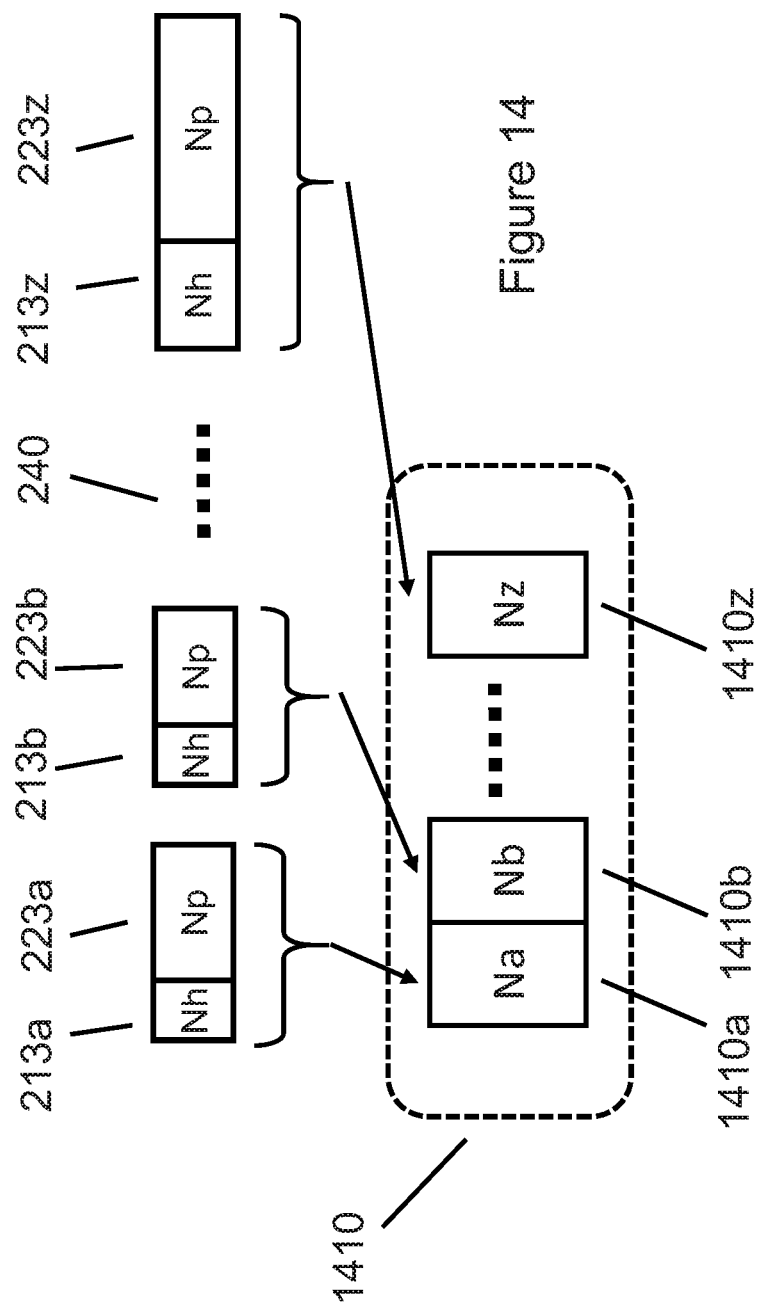
FIG. 14 illustrates an example of how an index of encoded block sizes might be generated.

FIG. 14 illustrates the optional creation of a group of indexes 1410 during encoding that can be used during decoding to provide random access into a plurality of encoded blocks of the technology described herein. FIG. 14 illustrates multiple encoded block pairs {header 213a, payload 223a}, {header 213b, payload 223b} thru {header 213z, payload 223z}. The number of bits, Bytes, or double words (dwords, or 32-bit words) in each of the encoded block pairs represents the size of the encoded block. In a preferred embodiment, the size of each encoded {header, payload} pair 213 is stored in index 1410 as a dword (4 Bytes). For instance, the number of dwords in encoded block {header 213a, payload 223a} is index entry Na 1410a, while the number of dwords in encoded block {header 213b, payload 223b} is index entry Nb 1410b. Once index 1410 has been created, FIGS. 15-18 below further describe how elements of index 1410 can be used to provide random access during decoding to a specific start location and number of elements.

FIGS. 15-18 describe a user-specified random access specifier in the form {startByte, NBytes}, where both startByte and NBytes refer to the original, uncompressed elements (typically Bytes) that are requested from the original input to the encoder that generated encoded blocks conforming to the encoded block format of the technology described herein. An equally useful, equivalent random access specifier may also have the form {startByte, endByte}, where endByte=startByte+NBytes−1. These two random access specifiers are equivalent and interchangeable. Either one can be used to specify which decoded elements the technology described herein returns to the user. For the examples provided in FIGS. 15-18 below, we assume that a random access specifier of the form {startByte, NBytes} will be used.

FIG. 15a illustrates how a user-specified (startByte 1510, NBytes 1520) random access specifier is converted into three random-access parameters {startBlk 1540, endBlock 1550, and NtossStart 1560}. In order to avoid having to decode all elements of a stream of encoded block that precede desired startByte 1510) the group of indexes 1410 can be used to begin decoding of the encoded block that contains startByte 1510. A decoder that supports decoding of the encoded blocks need only decode NtotBlocks 1570 in order to return the user-specified NBytes 1520.

As shown in the example of FIG. 15a, startByte 1510 is located in encoded block 210p. In a preferred embodiment of the technology described herein, block size 215 is equal for all input blocks, so startBlk 1540 is determined by dividing startByte 1510 by block size 215. Similarly, the last block to be decoded by the decoder is endBlk 1550, calculated by dividing endByte 1530 by block size 215. endByte 1530 is the sum of startByte 1510 and Nbytes 1520, minus one. The total number of blocks NtotBlks 1570 to be decoded is one plus the difference between endBlk 1550 and startBlk 1540. Since startByte 1510 does not necessarily correspond to the first decoded element of block 210p (startBlk 1540), the variable NtossStart 1560 specifies how many elements (typically Bytes) of the first block will be "tossed" (discarded) prior to returning the NBytes 1520 that the user requested in {startByte 1510, NBytes 1520} random access specifier.

Using the C programming language, FIG. 15b illustrates example calculations (performed by decoder 262) of startBlk 1540, endByte 1530, endBlk 1550, NtotBlks 1570, and NtossStart 1560, in the manner consistent with the parameters discussed with FIG. 15a.

Figure 16:
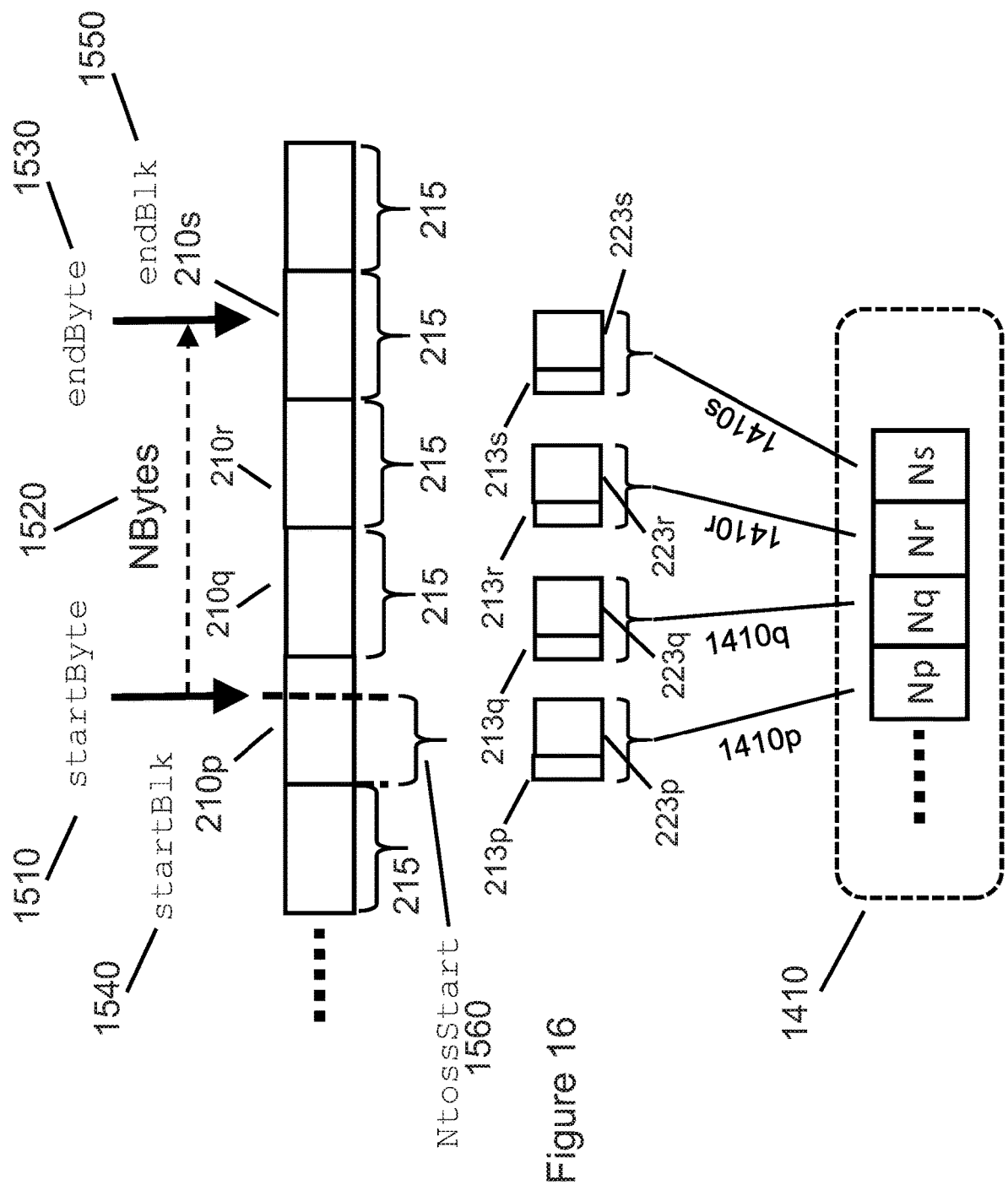
FIG. 16 illustrates an example of how the various block numbers, block counts, Byte offsets, and the index of encoded block sizes from FIGS. 14, 15a, and 15b might be used to provide random access into a stream of encoded blocks.

FIG. 16 illustrates additional details relating the original, uncompressed input blocks 210p, 210q, etc., each containing block size 215 samples, and their respective encoded block headers 213 and payloads 223. Specifically, encoder 212 converts the block size 215 elements of input block 210p into the encoded pair {encoded block header 213p, encoded block payload 223p}. In a similar manner, encoder 212 converts elements of input blocks 210q, 210r, and 210s into encoded pairs {encoded block header 213q, encoded block payload 223q}, {encoded block header 213r, encoded block payload 223r}, and {encoded block header 213s, encoded block payload 223s}, respectively. In the example of FIG. 16, the four encoded block pairs {213p, 223p} thru {213s, 223s} have sizes Np 1410p, Nq 1410q, Nr 1410r, and Ns 1410s, respectively. These four example block sizes Np 1410p thru Ns 1410s represent four of the elements in index 1410 of the technology described herein.

In response to a random access request, FIG. 17 illustrates how the first block to be decoded (startBlk 1540) is determined by decoder 262. If startBlk 1540 is not zero, a block counter iBlk 1710 and a dword seek counter j 1720 are initialized to zero. The "while" loop in FIG. 17 accumulates entries index 1410 encoded block sizes until the desired startBlk 1540 is found. The "fseek" function locates the start of encoded block startBlk 1540 by seeking 4*j Bytes. Since j is a double word [4-Byte] count, the seek distance is 4*j Bytes into the encoded file. After completing the programmed instructions in the example of FIG. 17, the file pointer into the file that contains the encoded blocks will be positioned at the start of startBlk 1540.

Figure 15:
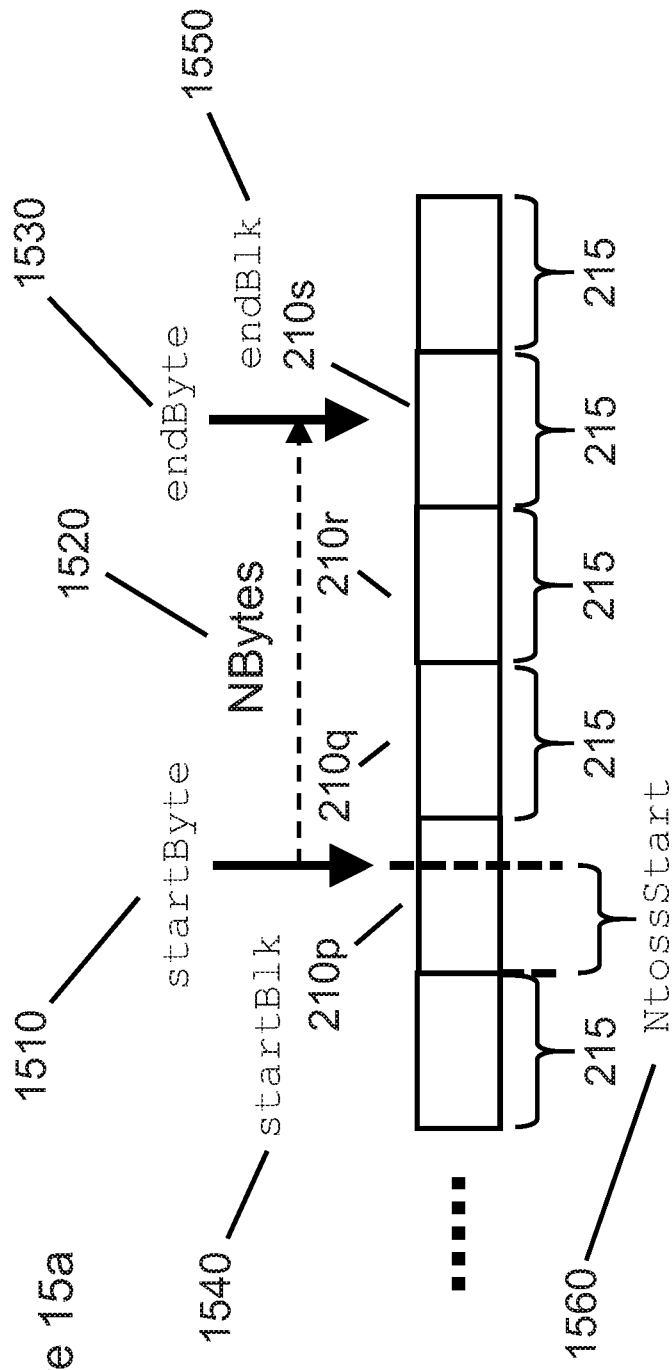

FIG. 18 illustrates how, after decoding NtotBlks 1570 encoded blocks, the total number of decoded elements generated by decoder 262 are processed to reflect NtossStart 1560. In the event that NtossStart 1560 (calculated as shown in FIGS. 15a and 15b) is greater than zero, the random access decoding operation by decoder 262 must "toss" (discard) the first NtossStart 1560 elements (typically Bytes) from uncompressed buffer uBuf 1810. Random access specifier {startByte, NBytes} and the calculations previously described in FIGS. 15-16 result in elements (typically Bytes) from uBuf[NtossStart] to uBuf[NtossStart+NBytes−1] being returned to the function that requested the random access decoding. In the example in FIG. 18, the desired NBytes 1520 are returned using a file write operation, where the first Byte returned is uBuf[j0](=uBuf[NtossStart]), and where the file write operation writes NBytes 1520 Bytes to the file containing the decoded output elements from decoder 262.

FIG. 19 provides an example that demonstrates how one of three token tables is selected for the count distribution for five literals in an example block. This example demonstrates the calculations that determine which of the available token tables encodes the list of events using the fewest bits. Since the goal of compression is to minimize the number of bits used to encode certain events, selecting the table having the best {token 960, token length 970} pairs that minimize the number of bits required to encode parameters related to those events also maximizes the block's resulting compression ratio for those event parameters.

FIG. 19a illustrates an example unique literals array 930. In this example, the number of unique literals 1905 is five (5), but selecting the table that requires the minimum number of bits for encoding uses the same procedures, regardless of the number of unique literals 1905. FIG. 19a also illustrates the literals counts array 1910. Literals array 930 contains the five literal Bytes {'e', 't', 'a', 'r', and 'Q'}, whose corresponding literals counts array 1910 is {483, 212, 56, 13, and 2}. For example, the literal 'e' occurs 483 times in the block, while the letter 'Q' appears twice in the block.

FIG. 19b illustrates three token tables {965a, 965b, 965c}, each having a different set of five pairs of {token 960, token length 970}. Token table 1 965a contains binary tokens 960a {0, 10, 110, 1110, 1111}, with corresponding token lengths 970a of {1, 2, 3, 4, 4}. Token table 2 965b contains binary tokens 960b {00, 01, 10, 1110, 111}, with corresponding token lengths 970b of {2, 2, 2, 3, 3}. Token table 1 965c contains binary tokens 960c {0, 100, 101, 110, 111}, with corresponding token lengths 970c of {1, 3, 3, 3, 3}. Those skilled in the art of data compression will recognize that tokens {960a, 960b, 960c} are uniquely decipherable, meaning that no valid token is the prefix of another valid token. The example of FIG. 19b uses three candidate token tables 965a, 965b, and 965c, but selecting the "best" table (the one that encodes the selected event parameters using the fewest bits) uses the same procedures described for this example, regardless of the number of candidate token tables.

FIG. 19c illustrates how the total encoded bit counts 1930 of the three candidate token tables are calculated, given the literals count array 1910 of FIG. 19a. For each candidate token table, the number of bits Nbits[tokTab] used is calculated by the following C code:

```
for (tokTab = 1; tokTab <= 3; tokTab++) {
    Nbits[tokTab] = 0;
    for (i = 0; i < 5; i++) {
        Nbits[tokTab] += sum(count[i]* tokLen[i]);
    }
}
```

As illustrated in FIG. 19c, the Nbits array contains values (1930a, 1930b, 1930c)={1135, 1547, 1332} bits. Since token table 965a generated the minimum Nbits value 1930a of 1135, token table 965a will be used to encode the five unique literals 930, having literals counts 1910 as shown in FIG. 19a.

The example described in FIG. 20 illustrates that the technology described herein may send the bits (fields) of each encoded block using different strategies. FIG. 20b illustrates a strategy that appends each event's parameters directly after each event's token. FIG. 20c illustrates a strategy that groups event parameters together in different block payloads 323. Each strategy has different advantages and disadvantages. Both strategies encode the input data using the same number of bits, and thus both strategies achieve the same compression of the data in this example input block.

FIG. 20a illustrates an example of a block to be encoded that contains ten events. Event types 2020 are selected from SEQ events 510, RUN events 520, LIT events 530, and DICT events 540, which were previously discussed in FIGS. 4 and 5. As previously shown in FIG. 4, each of the four event types are accompanied by 1 or 2 parameters, such as sequence length 414, sequence distance 416, run value 426, or literal value 434. In the example of FIG. 20a, param 1 row 2030 and param 2 row 2040 list the one or two parameters that are associated with each of the ten example event types 2020.

FIG. 20b illustrates a strategy that groups each event's parameters immediately following each event's token. FIG. 20b creates a serialized version 2050 of each of the fields of FIG. 20a.

In contrast, FIG. 20c illustrates a strategy that groups event parameter together in different block payloads 323a through 323g. After decoder 262 (not shown in FIG. 20c) decodes block payload 323a, which contains the block's event tokens, decoder 262 knows the number of each event type in the encoded block, as well as the order of events in the block. After decoding block payload 323a, decoder 232 knows that this example block contains three dictionary events (each having one parameter), three literal events (each having one parameter), two sequence events (each having two parameters), and two run events (each having two parameters). Next, decoder 232 decodes each of the parameters associated with each of the events, first decoding three dictionary event IDs from block payload 323b, then decoding three literal values from block payload 323c, then decoding two sequence lengths from block payload 323d, etc., until all parameters for all events 2020 have been decoded.

While the strategy described with FIG. 20b most closely matches the information presented for this example in FIG. 20a, it requires the most "state changes" in decoder 262. In software, a "state change" occurs every time a new event type 2020 occurs. Those familiar with programming techniques will recognize that such "state changes" require changes of control flow, either by using if/then/else constructs or switch/case constructs. Such state changes may slow down the performance of decoder 262. In contrast, after decoding block payload 323a, which contains the list of all events in the block, in the proper sequence, decoder 262 then knows how many event types occur in the block. Because each event type has a fixed, known number of associated parameters that are known both to encoder 212 and decoder 262, decoder 262 can then decode the parameters WITHOUT "state changes."

Thus the primary advantage of the strategy outlined in FIG. 20c may be that the number of "state changes" in decoder 232 is minimized using this strategy, when compared to the strategy of FIG. 20b. Minimizing "state changes" should result in faster performance of decoder 262, which those skilled in the art of programming would typically see as an implementation advantage.

Figure 21:
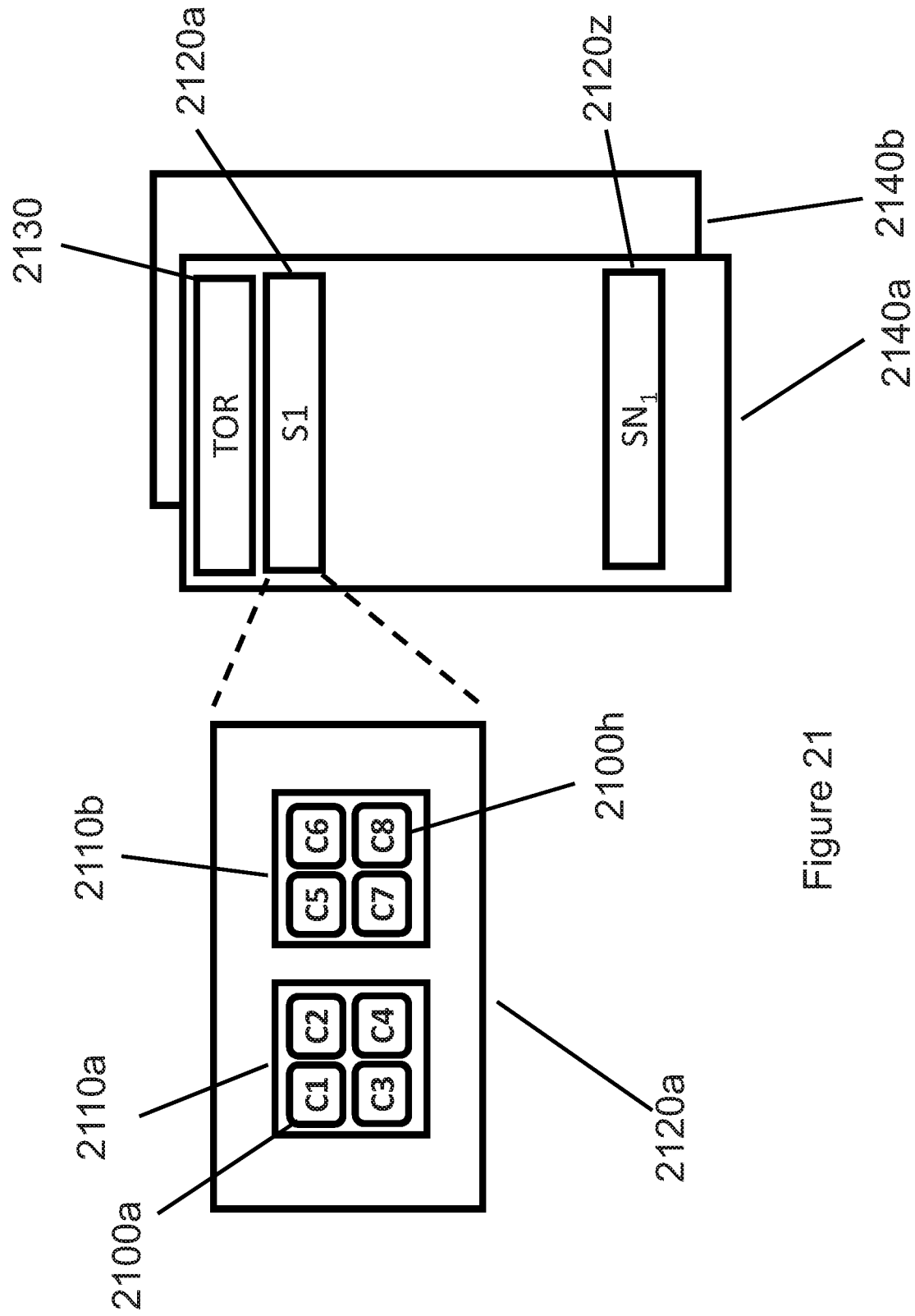
FIG. 21 illustrates typical Cloud datacenter components.

FIG. 21 illustrates datacenter compute and storage components, which constitute an example of a computer system including a processor that can include one or more special purpose and/or general purpose processing units, memory and at least one communication interface. Other computer system configurations can be used in various embodiments of the technology described herein. Encoding and decoding engines can be implemented using computer programs in computer systems that implement the methods described herein Both IaaS and App providers use, rent, own, or deploy datacenters that contain both compute and storage components. Presently (2016), datacenter storage requirements are increasing at 40% per year. Datacenter storage components include both solid state disks (SSDs) and hard disk drive (HDDs). The required annual investment in datacenter compute and storage components represents a significant infrastructure cost to both IaaS and App providers. FIG. 21 illustrates a typical rack-based deployment of both compute servers and storage components in datacenters. Racks are typically metal enclosures having the following approximate dimensions: 24" wide, 78" tall, and 40" deep. Datacenter rack dimensions can vary, but their dimensions do not affect the utility or implementation of the technology described herein.

FIG. 21 conceptually represents two datacenter racks 2140a and 2140b. Each rack is typically populated with a combination of compute servers and storage components 2120. Racks can exclusively contain servers (CPU plus memory plus optional SSDs and/or HDDs) or storage (SSDs and/or HDDs plus their associated controllers and/or servers), or a combination of servers and storage. Many datacenters use the top-most rack position to hold a top-of-rack (TOR) switch 2130, which provides the ports for networking gear that connects racks to each other, typically via multiple Ethernet or fiber-optic cables. In FIG. 21, elements 2120a thru 2120z represent multiple servers or storage components. FIG. 21 intends components 2120 to represent one or more server or storage components in datacenter racks, not necessarily 26 components as might be implied from the letters a . . . z.

The left side of FIG. 21 contains an expanded view of the components of a server 2120a. Compute server 2120a contains two compute integrated circuits (ICs) 2110a and 2110b. In the example of FIG. 21, each compute IC 2110a and 2110b contains four cores 2100. Core 2100a represents the first of four cores in compute IC 2110a, while core 2100h represents the fourth of four cores in compute IC 2110b. For simplicity, FIG. 21 omits various electronic and mechanical components that are typically also found within server racks, such as dynamic random-access memory [DRAM] dual in-line memory modules [DIMMs], printed circuit [PC] boards, backplanes, cables, power supplies, cooling channels, fans, etc. Those skilled in the art of datacenter design will recognize that when element 2120 in FIG. 21 represents a compute server, it can be used as a core (computational element) to execute the block-based compression and/or decompression software of the technology described herein. Presently (2017), examples of multi-core compute ICs 2110 include the Intel Xeon E5 family of processors and the AMD Opteron family of processors, including ARM-based CPUs in the Opteron-A family.

FIG. 22 illustrates why a compression algorithm would benefit from allowing users to systematically, automatically, or manually select an input block size during compression. As shown in FIG. 22, the preferred block size used during compression varies by use case. For instance, HDDs have historically been formatted to write and read 512-Byte sectors. Similarly, SSDs using multi-level cell (MLC) flash memory have historically used page sizes of 2,048 or 4,096 Bytes per page. These three examples would therefore select compressed input block sizes of 512, 2048, and 4096 Bytes, respectively. FIG. 22 also lists examples for Ethernet packet size (1,500 Bytes), virtual memory (4,096 Bytes), and cache memory lines (32 or 64 Bytes).

Figure 23:
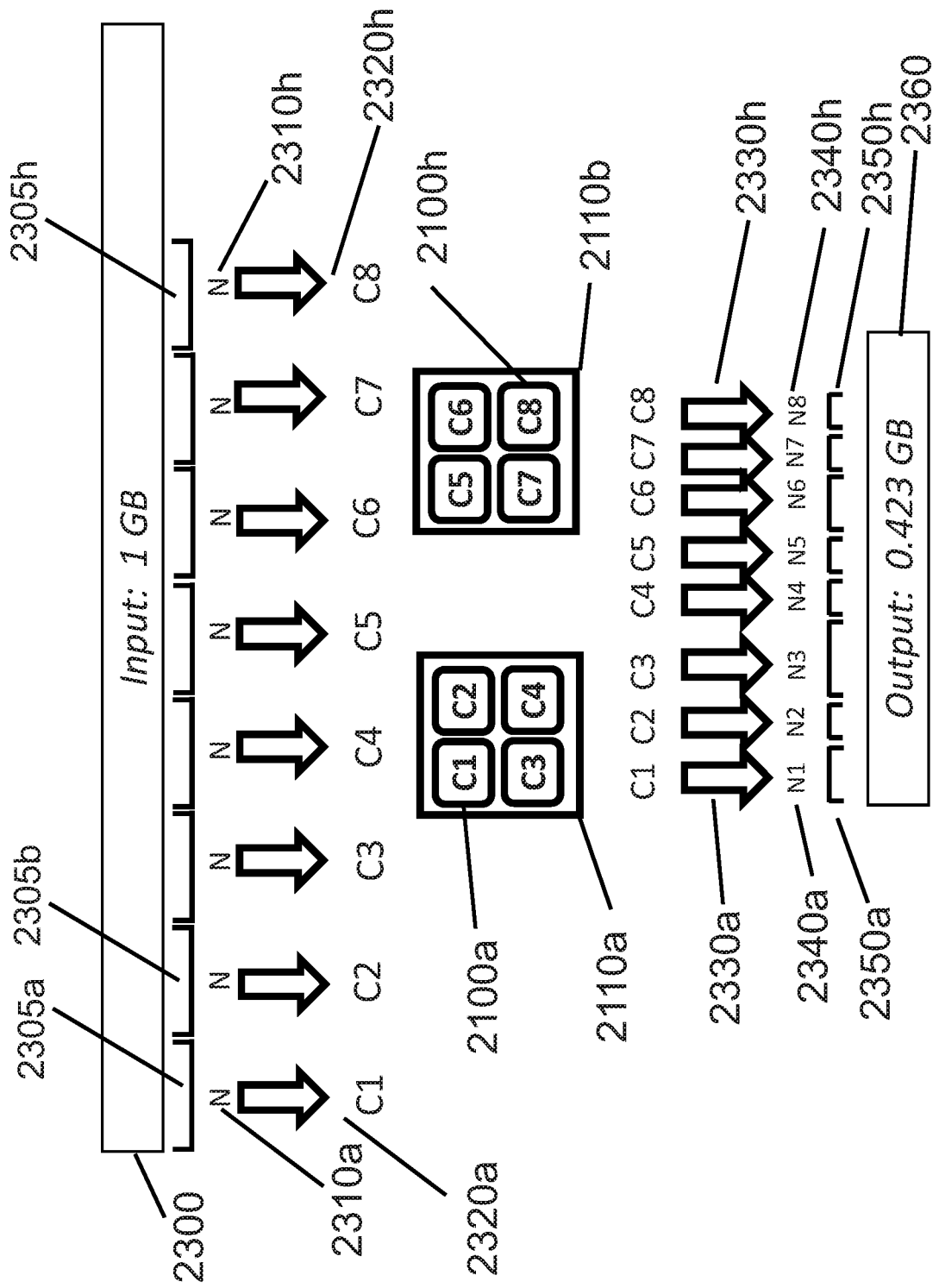
FIG. 23 illustrates an example assignment of input blocks to be compressed by cores (CPUs).

FIG. 23 illustrates an example block-based compression of a 1 GB input file 2300 into 0.423 GB compressed output file 2360. In this specification, the terms file, object, blob, table, etc. are used interchangeably; those skilled in the art of computer science will recognize that such terms all refer to data that is somehow related and typically logically (but not necessarily physically) grouped together for an end use, often with a key or name that uniquely identifies the file, object, blob, table, etc.

A block-based compressor as described in this specification first divides input file 2300 into equal-sized blocks of N Bytes 2310a to 2310h.

While block size N 2310a through block size N 2310h are shown in FIG. 23 as being equal in size, the technology described herein would perform equally well if N were not equal for each block. For example, block size N 2310 could follow a periodic pattern (such as 1000, 1010, 1020, . . . , 1100 Bytes) that repeats every $N_{repeat}$ blocks. Many alternative, periodic or non-periodic, sequences of block sizes N 2310 are possible, but the simplest (and thus also the preferred) embodiment is to use block size N 2310 as the size for all input blocks.

In FIG. 23, input file 2300 is divided into a first input block 2305a of size N elements 2310a, a second N-Byte input block 2305b, continuing through an eighth N-Byte input block 2305h of size 2310h elements, for all, or a subset of, input file 2300. In the example of FIG. 23, each of the first eight N-Byte input blocks 2305a thru 2305h are submitted to core C1 (2100a) in compute IC 2110a thru core C8 (2100h) in compute IC 2110b, respectively. As each core compresses its respective N-Byte input block 2305, it generates compressed output blocks 2350a (generated by core C1 2100a in compute IC 2110a) thru output block 2350h (generated by core C8 2100h in compute IC 2110b). In FIG. 23, variables N1 2340a thru N8 2340h represent the compressed block sizes, as measured in appropriate units such as Bytes or double-words [4-Byte dwords]) resulting from the compression of N-Byte input blocks 2305a thru 2305h, respectively. Lossless compression typically generates compressed blocks 2350 whose size 2340 varies, depending on the compressibility of each input block 2305's contents. Compressed size 2340 is typically smaller (less than) corresponding input block size 2310.

In FIG. 23, arrows 2320a thru 2320h connecting uncompressed input blocks 2305a thru 2305h to cores 2100a thru 2100h, as well as arrows 2330a thru 2330h connecting cores 2100a thru 2100h to compressed output blocks 2350a thru 2350h, represent the systematic, arbitrary, or random assignment of input blocks 2305 to be compressed to available cores 2110 that perform the compression of each input block. Those skilled in the art of datacenter processing will recognize that a compression algorithm that can independently compress any input block (and decompress any compressed block) can assign any input block having block size 2310 to any available core 2100. We emphasize that this flexibility of assignment between input data blocks 2305 and cores 2100 provided by the technology described herein is a very attractive feature for IaaS and App providers, especially in light of the drawbacks of existing compression algorithms already described in the Background section of this specification.

Those skilled in the art of datacenter processing will recognize that cores 2100 are typically implemented using the cores of a multi-core Central Processing Unit (CPU), for example a multi-core Intel Xeon E5-v4 family processor, whose members include core counts between 4 and 22 cores. However, the technology described herein could also use other processing cores, such as those available in graphics processing units (GPUs), such as those offered by Nvidia Corporation or AMD Corporation, as well as field-programmable gate arrays such as those offered by Xilinx Corporation and Intel's Programmable Solutions Group (formerly Altera Corporation). Such alternative GPU or FPGA processors are also able to perform the block-based processing required by the technology described in this specification. As used in this specification and in its claims, the term "core" applies to any type of processing element, including CPUs, GPUs, and FPGAs, all of which may implement a "core" of the technology described herein.

A compression and decompression algorithm that compresses and decompresses each input block independently of all other blocks provides the significant flexibility of assigning compression and/or decompression tasks to any available (un-allocated; idle) cores. In Cloud computing, physical datacenter components such as compute cores and storage elements are typically over-provisioned, which means that excess compute capacity is nearly always available. Both IaaS and App providers over-provision datacenter compute and storage resources so that the available hardware and software will be sufficient to handle peak user demand as required over various time units, such as minutes or months. However, most of the time, this peak demand rarely occurs, so idle compute cores are nearly always available.

The technology described herein can exploit available (idle) compute cores to reduce the cost of datacenter storage. Alternately, the technology described herein could also be implemented using dedicated cores for compression and/or decompression. However, the cost of such dedicated cores for compression and decompression might increase overall datacenter costs, while the re-use of available, already-purchased (but idle) cores would not increase overall datacenter costs.

The technology described herein can also reduce the cost of other datacenter components, such as DRAM or on-chip cache memory, by implementing the block-based compressor during DRAM or cache memory writes, and by implementing the block-based decompressor during DRAM or cache memory reads. For such DRAM and/or cache use cases, the speed of DRAM and cache transactions typically requires a hardware implementation of the technology described herein, such as by integrating the technology described herein with existing DRAM and/or cache controllers.

Figure 24:
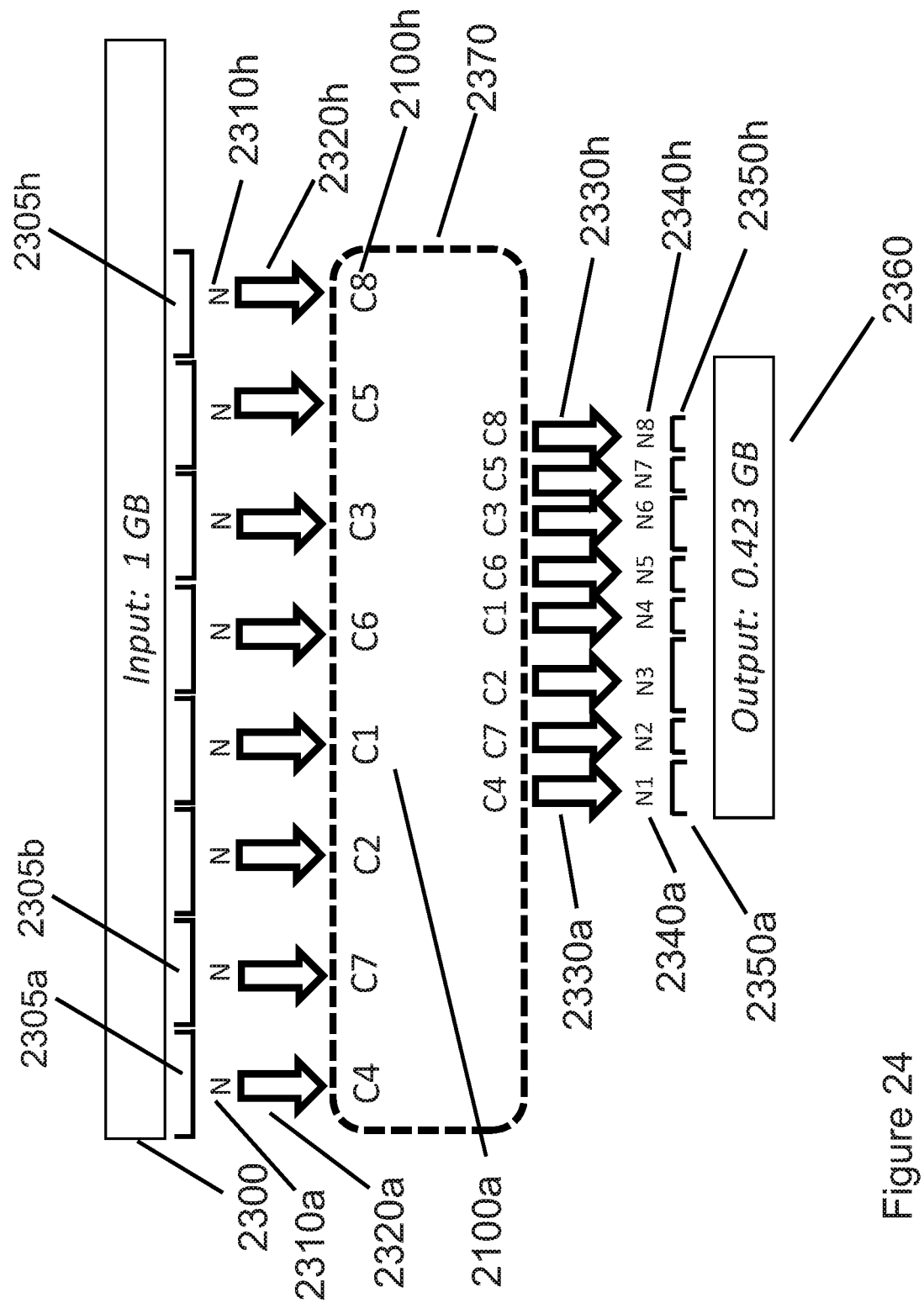
FIG. 24 an alternate assignment of input blocks to cores (CPUs).

FIG. 24 illustrates an alternate (but equally effective) mapping between input blocks 2305a thru 2305h to cores 2100a thru 2100h, but in a different order than the mapping shown in FIG. 23. FIG. 24 illustrates load balancer or task allocator 2370 that assigns input blocks 2305 having block size 2310 to cores 2100 of compute ICs 2110a and 2110b (not shown in FIG. 24). Those skilled in the art of datacenter processing will recognize that the flexible assignment of compression tasks or threads to available compute resources can be manually or programmatically (automatically) performed. Furthermore, this assignment can be static (fixed for a certain time period) or dynamic. At present (2017), the functions of load balancer or task allocator 2370 can be performed by a variety of existing techniques:

- load balancers (examples: Amazon AWS Elastic Load Balancing; Microsoft Azure Load Balancer),
- container schedulers (examples: Docker Swarm, Apache Mesos, Google Kubernetes), and
- Microservices techniques (examples: Amazon AWS Lambda, Microsoft Azure Functions, and Google Cloud Functions).

The block-based compression and decompression functions can be allocated or scheduled using any of the task allocation techniques listed above, as well as other, future task allocation techniques not described herein.

Figure 25C:
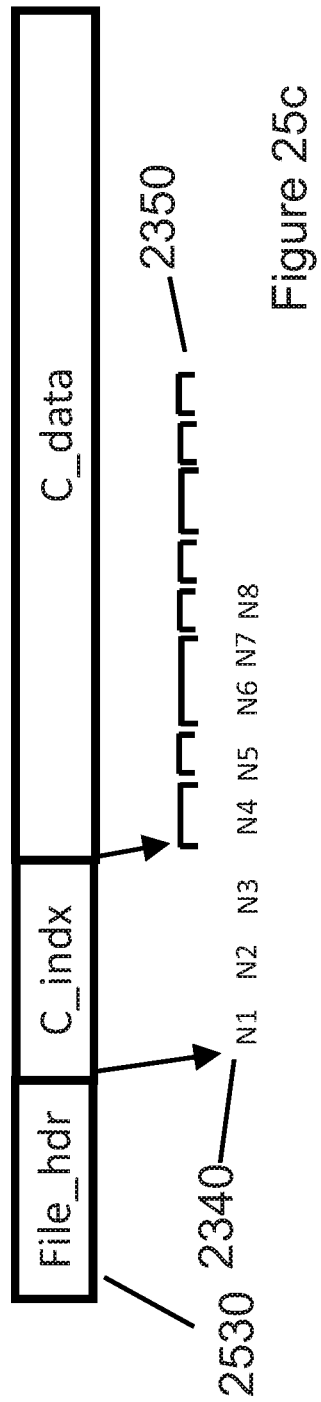
FIG. 25c illustrates an example compressed file containing both a compressed index and its corresponding compressed blocks.
Figure 25D:
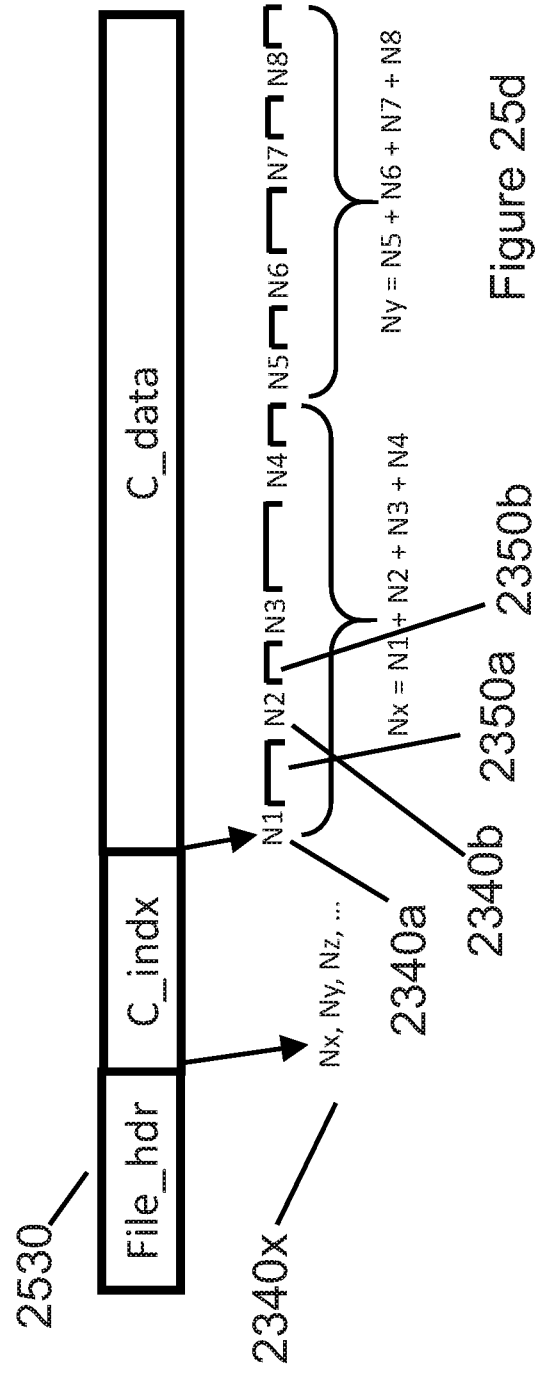
FIG. 25d illustrates an example compressed file format having both an index to a subset of compressed blocks and compressed block headers that include each compressed block size.

FIGS. 25a thru 25d illustrate four alternate ways that a stream of compressed blocks 2350 and the stream's corresponding list of compressed block sizes 2340 can be managed, using a file system (FIG. 25b), a file header (FIG. 25c), or a merged file index (FIG. 25d). FIGS. 25a through 25d reference components 2340 and 2350 that were previously identified with encoded output blocks shown in FIGS. 23 and 24. The examples shown in FIG. 25 are intended for applications that require random access into the aggregate collection of encoded blocks 2350. Applications that decode encoded objects in their entirety may not require the block size 2340 shown in FIG. 25, because the primary purpose of block sizes 2340 is to support random access into one or more encoded blocks in a collection of encoded blocks 2350.

FIG. 25a illustrates the first 8 compressed blocks 2350a thru 2350h, having compressed block sizes N1 2340a thru N8 2340h, respectively.

FIG. 25b illustrates how a computer's file system might manage the random retrieval (decompression) of varying-size, sequential compressed blocks 2350a thru 2350h in file A 2360 created by the compression. In FIG. 25b, a file system (not shown in FIG. 25b) appends each file header 2530 with two file components: block size list pointer 2510 and data pointer 2520. Block size list pointer 2510 points to the first Byte of compressed block size 2340a, having value N1. Data pointer 2520 points to the first Byte of compressed block 2350a. The block size list may include a field (not shown in FIG. 25b) containing the number of pointers in compressed block size list 2340, so that the decoder knows how many block pointers are stored in compressed block size list 2340, as well as the number of compressed blocks 2350. The discussion with FIG. 26 describes one way that compressed block sizes 2340 can be converted to compressed block indices or file offsets.

FIG. 25c illustrates an alternate method of storing compressed block size list 2340 and compressed blocks 2350, in a manner that does not require operating system or file system support. Instead, the structure illustrated in FIG. 25c is processed by applications that recognize the format of block-based compressed files that also supports random access. This recognition could be achieved in a variety of ways, including via special file names (for example, filenames that include the filename suffix "_random_access"), or dedicated file extensions (the suffix characters of a filename, such as are commonly used by the Microsoft Windows operating system, typically following the "." Character, such as the ".txt" extension for text-format files).

FIG. 25c illustrates an example compressed file having three components: file header 2530, compressed block size list 2340, and compressed blocks 2350. In this example, applications that can parse compressed files (i.e. that are able to parse the block-based compressed file format) can also separate the compressed block size list 2340 and the compressed blocks 2350. In a preferred embodiment, file header 2530 contains both compressed block size 2310 and the total number of compressed blocks in the compressed file, i.e. the number of file sizes in compressed block size list 2340.

FIG. 25d illustrates yet another alternate file format that combines a number of elements of compressed block size list 2340x for multiple compressed block sizes 2340a, 2340b, etc. For example, in FIG. 25d, if input block size 2310 (not shown in FIG. 25d) were 512 Bytes, merged compressed block size list might include the sum of four consecutive compressed blocks (such as N1+N2+N3+N4), where the merged compressed block size list 2340x contains the sum of four compressed block sizes 2340. In this alternative, merged compressed block index 2340x is used for random read access to index to the compressed block that precedes the desired compressed block (within 4*512 Bytes, in this example). As the first four blocks (4*512 Bytes) are decompressed, the block-based decompressor may have to discard decompressed data from the first 0, 1, 2, or 3 blocks, depending on the start Byte requested by the user. Random access calculations during decompression (such as those illustrated in the example with FIG. 26) return the requested start block and number of encoded blocks to be decompressed in this example random access read operation. FIG. 25d illustrates one method whereby the size of merged compressed block list 2340x can be reduced, relative to the original compressed block list 2340 of FIGS. 25a, 25b, and 25c. By using a merged block list, the overall compressed file size is reduced while still supporting random read access into the stream of compressed blocks 2350.

Figure 26:
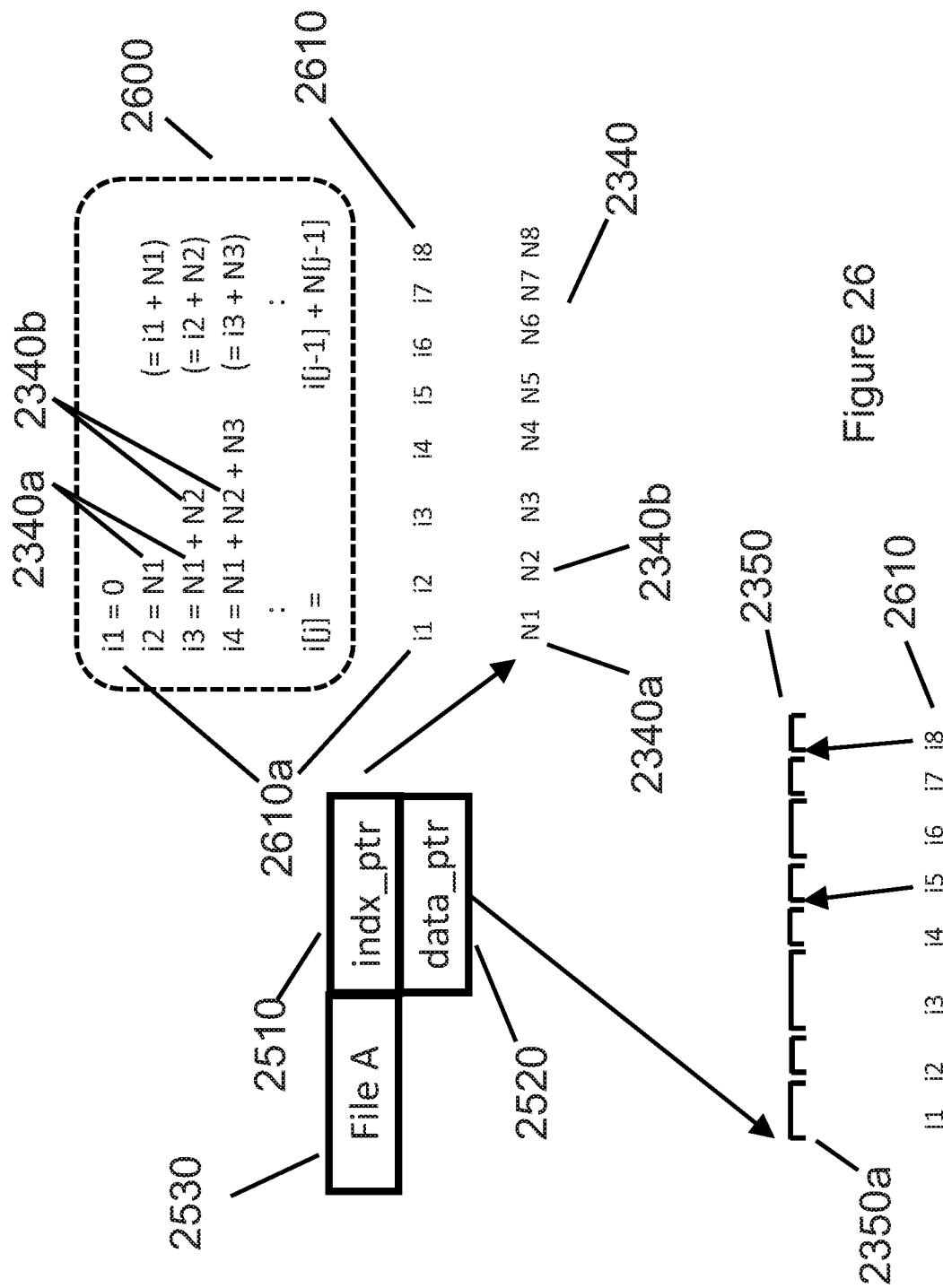
FIG. 26 illustrates a way that compressed block sizes can be converted to file offsets or file indices.

FIG. 26 illustrates a transformation algorithm 2600 that transforms compressed block size list 2340 into a list of compressed block file offsets 2610. Since compressed blocks 2350 are often (but not always) stored consecutively in a compressed file, each compressed block's file offset 2610 is calculated simply by accumulating the sum of compressed block sizes 2340. This procedure is illustrated in transformation algorithm 2600 shown in FIG. 26, in which compressed block file offsets 2610 are created by accumulating the compressed file sizes 2340 that precede the compressed block. As shown in FIG. 26, the first compressed block file offset 2610a (for i1=0) is relative to the first Byte of data pointer 2520, not to the start of file header 2530.

Figure 27A:
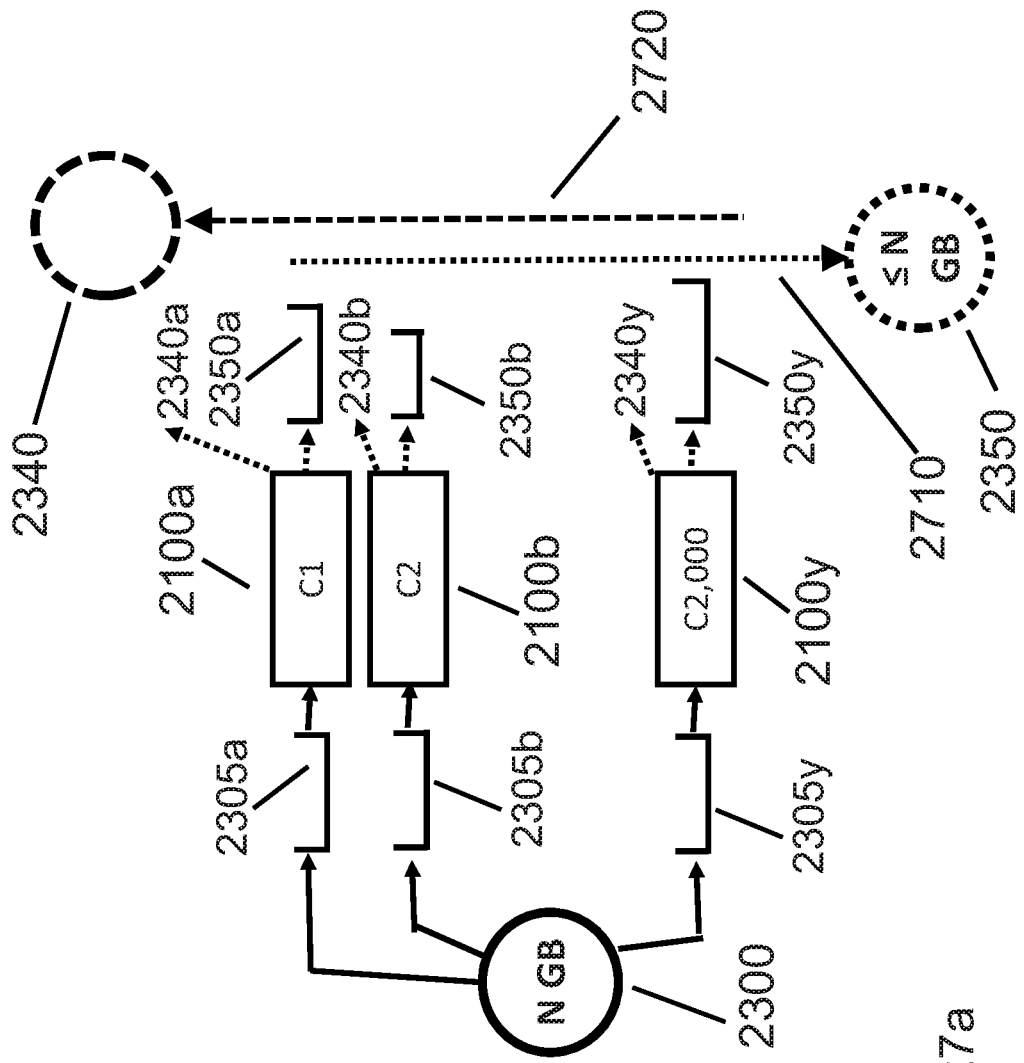
FIGS. 27a and 27b provide examples that demonstrate how a larger number of cores running compression and decompression software decreases compression and decompression processing time (latency).
Figure 27B:
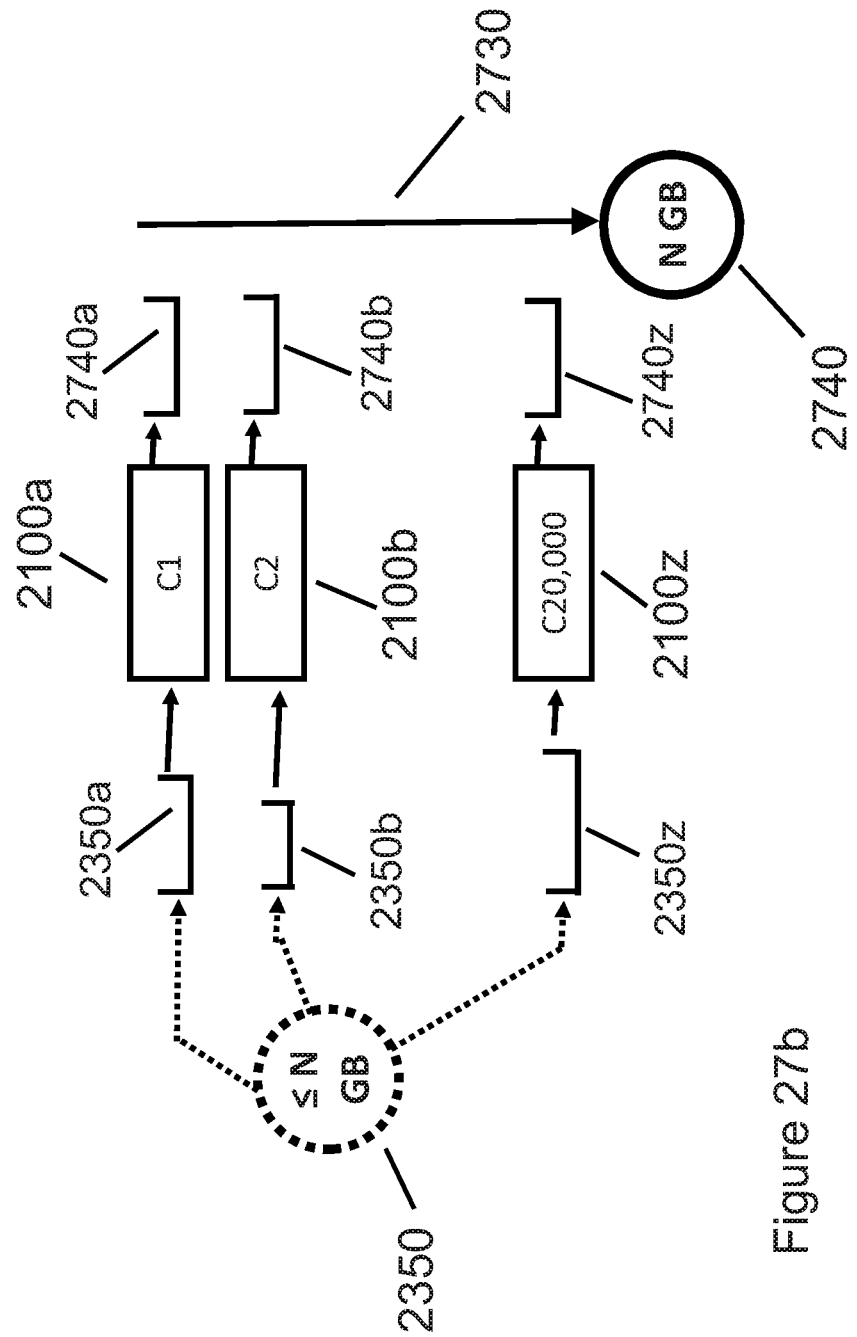

FIGS. 27a and 27b provide two examples that illustrate how the number of compute cores affects encoding and decoding processing time (throughput and latency). In the illustrative examples of FIGS. 27a and 27b, we assume an encoder that operates at 10 MB per second per core and a decompressor that operates at 100 MB per second per core, respectively. In both cases, the listed encoding and decoding rates are measured with respect to the uncompressed data, i.e. as measured at the input side of the encoder and at the output side of the decoder. Thus in these examples, decompression runs ten times faster than compression on a core such as compute core 2100a or 2100b.

The examples of FIGS. 27a and 27b assume that the block-based compressor converts the N GB input file 2300 to encoded file 2350, where the size of encoded file 2350 is less than or equal to the size of input file 2300. The "or equal to" case is included here because if input file 2300 contains data that has already been compressed (such as compressed video or audio), then additional compression cannot typically be achieved. FIG. 27a illustrates how 2,000 compute cores 2100a, 2100b, . . . 2100y are used to compress N GB of input file 2300 into compressed output file 2350. As previously discussed with respect to FIGS. 23 and 24, each of 2000 compute cores 2100a thru 2100y compresses a separate, non-overlapping block of input file 2300. In FIG. 27a, these separate blocks are indicated as 2305a, 2305b, . . . 2305y. For instance, if N=1 GB, then each of the 2,000 cores 2100a . . . 2100y will encode 1 GB/2,000=500 kB of input file 300. With an assumed encoding rate of 10 MB/sec in this example, each core compresses its 500 kB of input data in 50 msec (500 kB/(10 MB/sec), or ½0 of a second). In the example of FIG. 27a, the overall compression throughput using 2,000 cores is 20 GB/sec (10 MB/sec per core×2000 cores). FIG. 27a shows that the individual encoded blocks 2350a . . . 2350y output by the 2,000 cores 2100a . . . 2100y are then typically combined by multiplexer 2710 into encoded output file 2350. Similarly, the individual encoded block sizes 2340a . . . 2340y output by the 2,000 cores 2100a . . . 2100y are then typically combined by multiplexer 2720 into block size array 2340. Those skilled in the art of computer science will recognize that the term "multiplexer" used with elements 2710 and 2720 may simply mean that the output blocks 2350a . . . 2350y and encoded block sizes 2340a . . . 2340 are stored together in a storage or memory (somehow related to each other, perhaps by a common file or object name).

The decoding example in FIG. 27b uses 10 times more cores (20,000 cores 2100a, 2100b, . . . 2100z in FIG. 27b), compared to the 2,000 cores 2100a, 2100b, . . . 2100y used for encoding, as illustrated in the example of FIG. 27a. For simplification, FIG. 27b omits the encoded block sizes 2340, as the random access capability supported by encoded block sizes 2340 was previously described with FIGS. 25 and 26. In the example of FIG. 27b, each core 2100 generates 1 GB/20,000 cores=50 kB blocks of decoded data 2740a, 2740b, etc. In total, the example decoding task example in FIG. 27b only takes 500 microsec (50 kB/100 MB/sec per core, or ½₀₀₀ of a second) to generate 1 GB of decoded data 2700. In the example of FIG. 27b, the overall decode throughput using 20,000 cores is 2 TB/sec (100 MB/sec per core×20,000 cores). FIG. 27b shows that the individual encoded blocks 2740a . . . 2740z output by the 20,000 cores 2100a . . . 2100z are then typically combined by multiplexer 2730 into decoded output file 2740. As described with FIG. 27a, the term "multiplexer" used with element 2730 may simply mean that decoded output blocks 2740a . . . 2740z are stored together in a storage or memory.

The encoding and decoding operations performed by cores 2100 in the technology described in this specification are intended to operate concurrently (simultaneously), where "concurrent" means "at least one encoding or decoding operation partially or completely overlaps in time with a similar (encoding or decoding) operation." Since a novelty of the technology described herein is the ability to independently encode original blocks of data, and to independently decode encoded blocks of data, encoding and decoding throughput are maximized, and encoding and decoding latency are minimized, by concurrently encoding as many original data blocks 2305 as possible during encoding, and by concurrently decoding as many encoded blocks 2350 as possible during decoding. While the number of cores 2100 may be limited or bounded for a variety of reasons, encoding and decoding throughput are maximized, and encoding and decoding latency are minimized, by using as many available cores 2100 as possible during the encoding and decoding operations of the technology described herein.

FIGS. 27a and 27b illustrate the outcome when IaaS and/or App providers use the block-based encoder and decoder to reduce storage requirements: as more idle cores are assigned to run encoding and decoding functions, compression and decompression operations run faster and thus finish sooner. In summary, encoding and decoding speed is increased (and compression and decompression latency is decreased) when additional cores are used. In the block-based encoding and decoding, processing speed is proportional to the number of processing cores.

The examples of FIGS. 27a and 27b assume that file input/output transfer time from storage nodes holding input data 2300 or encoded data 2350 to computational cores 2100 is much less than compression or decompression processing time. This assumption may not always be valid, but the speed of data distribution in Cloud storage is primarily under the control of the IaaS or App provider. By using the block-based compressor and decompressor, the Cloud vendor can improve the speed of compression and/or decompression by allocating more cores for encoding and/or decoding functions.

FIGS. 28a and 28b illustrate the parameters and operations of encode_blks function 2800a and 22800b, respectively. In FIG. 28a, encode_blks function 2800a represents the Application Programming Interface (API) of the encode_blks function, while in FIG. 8b, encode_blks function 2800b represents the function's operations on function input 2810 (input blocks 2305), generating function output 2860 (list of compressed block sizes 2340) and function output 2870 (compressed blocks 2350). FIG. 28a illustrates five example parameters that are provided to encode_blks function 2800a: input buffer pointer 2810, compressed buffer pointer 2820, compressed block size list pointer 2830, block size 2310, and number of encoded blocks 2840. Those skilled in the art of computer science will recognize that FIG. 28a illustrates encode_blks function 2800a in the style used for the C programming language, where the "*" preceding inBuf, compBuf, and cBlkSizes indicates a pointer to the first element of the respective named array. Block size 2310 typically contains an integer between the minimum and maximum allowed encode_blks block size. Block size 2310 might typically have a size of 4 Bytes, allowing a maximum block size of 4.29 GB ($2^{32}$ Bytes). For convenience, block size 310 is often chose to be a power of two (512, 1024, 2048, etc.). Similarly, number of encoded blocks 2840 typically contains an integer comprising 4 or 8 bytes, enabling the technology described herein to encode a maximum of $2^{32}$ ($2\times10^9$) or $2^6$ ($2\times10^{18}$) blocks.

In FIG. 28b, input buffer 2305 contains the input data to be divided into blocks of N 2310 elements and then to be compressed, where the first element of the first input block is stored at the location pointed to by input buffer pointer 2810. Number of blocks 2840 indicates how many blocks (each containing block size 2310 elements or less) are to be encoded (compressed). Encode_blks function 2800b receives input parameters and Nblocks 2840 input blocks and performs encoding of each input block 2310 using one or more cores (not shown in FIG. 28b), generating compressed block size list 2340 and compressed blocks 2350. As shown in FIG. 28b, the first element of compressed block size list 2340 is stored at the location pointed to by compressed block size list pointer 2830. Similarly, the first element of the first compressed block 2350 is stored at the location pointed to by compressed buffer pointer 2820.

FIGS. 29a and 29b illustrate the parameters and operations of decode_blks function 2900. In FIG. 29a, decode_blks function 2900a represents the C-style Application Programming Interface (API) of decode_blks, while in FIG. 29b, decode_blks function 2900b represents the function's operations on encoded blocks 2350 and the list of compressed block sizes 2340. FIG. 29a illustrates five example parameters provided to decode_blks function 2900a: compressed buffer pointer 2820, compressed block size list pointer 2830, decoded buffer pointer 2910, start block 2920, and number of decoded blocks 2930. Those skilled in the art of computer science may recognize that FIG. 29a illustrates decode_blks function 2900a in the style of the C programming language, where the "*" preceding compBuf, cBlkSizes, and decBuf indicates a pointer to the named array. Start block 2920 typically contains an integer up to the maximum number of compressed blocks in compressed blocks 2350. Start block 2920 typically contains an integer comprising 4 or 8 bytes, thus start block 2920 can have a maximum value of $2^{32}$ ($2\times10^9$) or $2^{64}$ ($2\times10^{18}$). Similarly, number of decoded blocks 2930 typically contains an integer comprising 4 or 8 bytes, enabling a maximum of $2^{32}$ ($2\times10^9$) or $2^{64}$ ($2\times10^{18}$) blocks to be decoded.

In FIG. 29b, encoded blocks 2350 are to be decoded (decompressed). The first element of the first encoded block 2350 is stored at the location pointed to by compressed buffer pointer 2820. The size of each encoded block 2350 to be decoded is stored in a corresponding compressed block size list 2830. Start block 2920 indicates the first block to be decompressed. Each decoded block 2700 contains the same number of Bytes, typically equal to block size 2310 from FIG. 28a. Number of blocks 2930 indicates how many encoded blocks (each generating 2310 elements after decoding) are to be decoded (decompressed), including start block 2920. In FIG. 29b, decode_blks function 2900b accepts input parameters 2960 and performs decoding of each compressed block 2350 using one or more cores (not shown in FIG. 29*b*), generating decompressed blocks 2700. Each decompressed block 2700 typically contains block size 2310 Bytes (from FIG. 28*a*). As shown in FIG. 29*b*, the first element of the first decompressed block 2700*a* is stored at the location pointed to by decoded buffer pointer 2910. In the example shown in FIG. 29*b*, start block 2920*a*=4 (begin decoding at the fourth compressed block), and number of blocks 2930*a*=3 (decode three encoded blocks 2350). As previously discussed with FIG. 26, decode_blks function 2900*b* can transform elements on the list of compressed block sizes 2340 into a list of compressed block file offsets 2610. In the example in FIG. 29*b*, since start block 2920*a*=4, decode_blks function 2900*b* begins decoding at the fourth compressed block file offset 2920. Decode_blks function 2900*b* continues until it has decoded number of blocks 2930*a*=3 decoded blocks, each of which contains block size 2310 Bytes.

Figure 30:
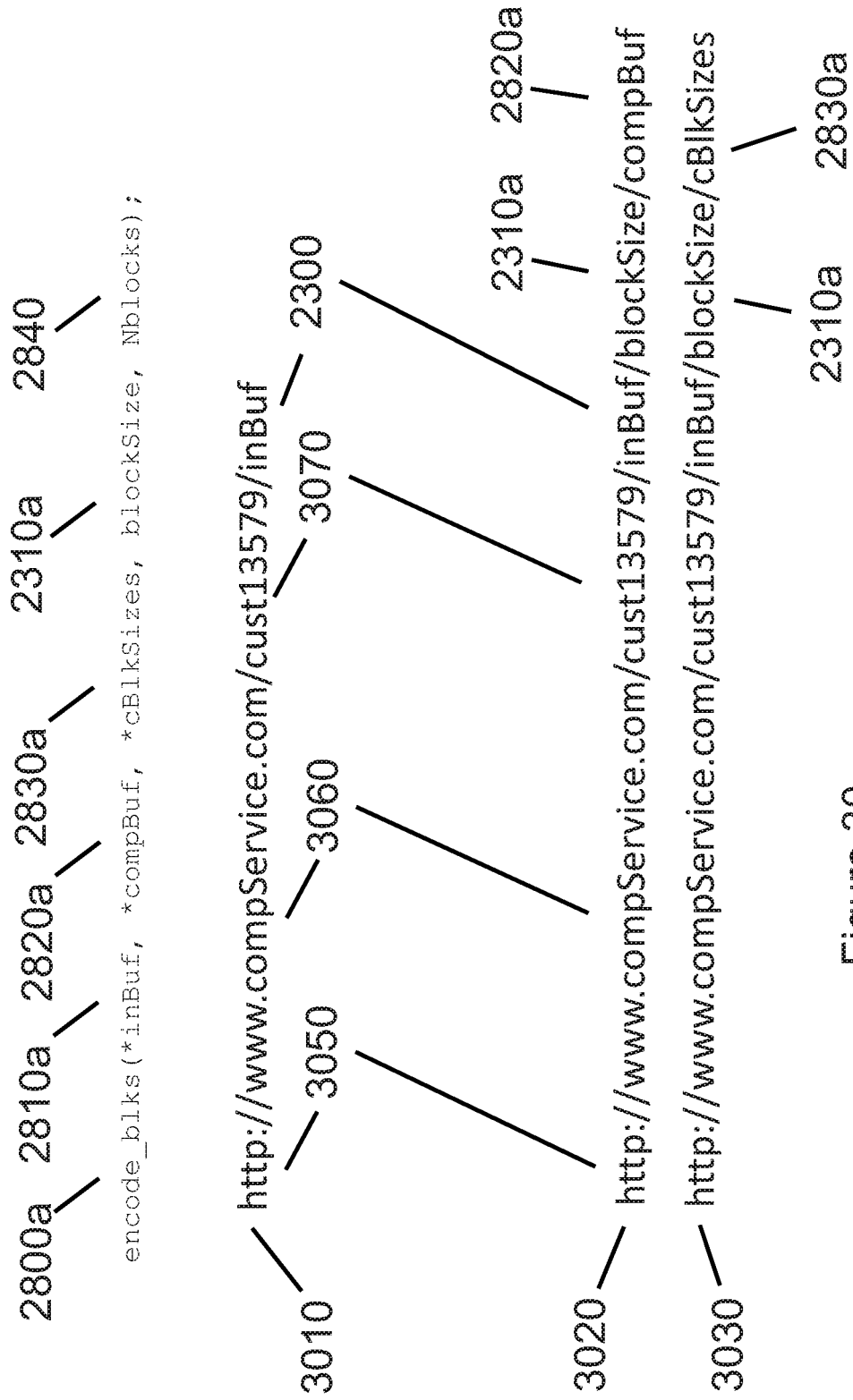
FIG. 30 illustrates an example of how the encode function parameters could be mapped to a Web service's URI fields.

FIG. 30 illustrates a mapping between the encode_blks function 2800*a* (in the C programming language style) and the Representational State Transfer (REST) Web (Internet) services style. Those skilled in the art of Web services will be familiar with the combination of HTTP protocol methods (further discussed with FIG. 32), such as PUT (compress) and GET (decompress) for the technology described herein, and a representation of the objects or files that are manipulated by the HTTP methods, such as an input file to be compressed, or a compressed file to be decompressed. In FIG. 30, input buffer 2810*a* in the C-style API is mapped to the input data Universal Resource Identifier (URI) (sometimes also called a Universal Resource Locator, or URL) 3010. Similarly, a compress (encode) operation performed on the data indicated by input data URI 3010 generates compressed data URI 3020 (which contains the compressed version of the data referenced by input URI 3010) and compressed block size list URI 3030 (which contains the size of each compressed block, after URI 3010 is compressed). In the example shown in FIG. 30, input data URI 3010, compressed data URI 3020, and compressed block size list URI 3030 share four fields: protocol identifier field 3050, web site identifier field 3060, customer identifier field 3070, and input buffer identifier field 2810*a*. Although other URI (URL) naming conventions are possible, the example shown in FIG. 30 maps block size 2310*a* in the C-style API to URI block size identifier 2310*a*. Similarly, the example shown in FIG. 30 maps compressed buffer pointer 2820*a* in the C-style API to compressed data field 2820*b*, and maps compressed block size list pointer 2830*a* in the C-style API to compressed block list URI field 2830*b*.

Many other mappings from C-style API functions to REST-style methods are possible. FIG. 30 illustrates just one such mapping. Other mappings are possible for containers, and yet others for microservices. Similarly, the number of cores used for the encode_blks and decode_blks functions is not indicated in FIG. 30. The assignment of compute resources that perform the encoding and decoding depends upon the number of available (idle) cores, the total number of cores, and the maximum number of cores that the IaaS and/or App provider may allocate for the encode and/or decode functions.

Figure 31:
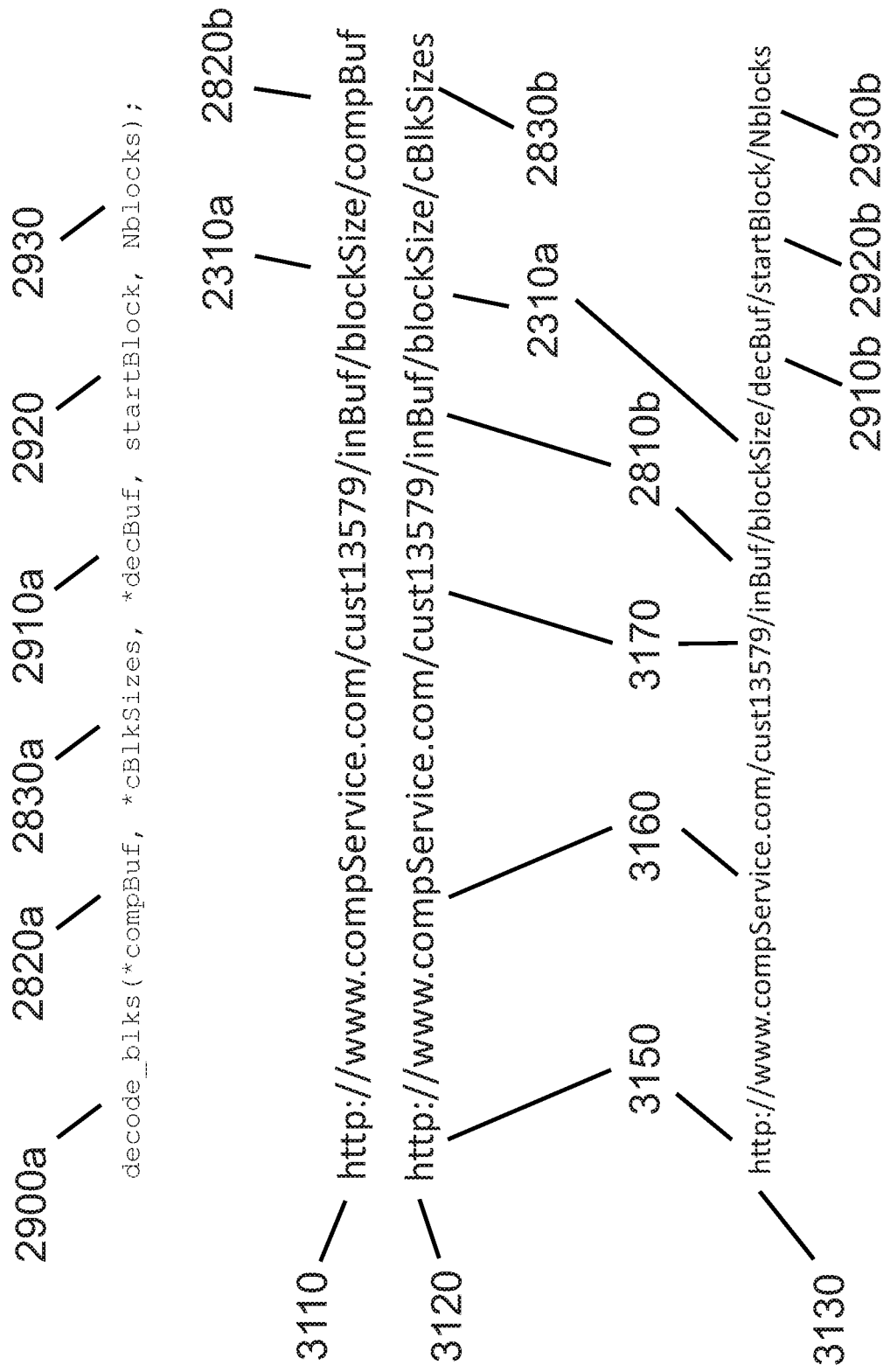
FIG. 31 illustrates an example of how the decode function parameters could be mapped to a Web service's URI fields.

Similar to FIG. 30, FIG. 31 illustrates a mapping between the decode_blks function 2900*a* (in the C programming language style) and the Representational State Transfer (REST) Web (Internet) services style for decoding in the technology described herein. In FIG. 31, compressed buffer 2820*a* in the C-style API is mapped to the compressed data URI 3110, and compressed block size list 2830*a* in the C-style API is mapped to compressed block size list URI 3120. decode_blks function 2900*a* generates decompressed data 2990 referenced by decoded data URI 3130. In the example shown in FIG. 31, compressed data URI 3110, compressed block size list URI 3120, and decoded data URI 3130 share four fields: protocol identifier field 3150, web site identifier field 3160, customer identifier field 3170, and input buffer identifier field 2810*b*. Although other URI (URL) naming conventions are possible, the example shown in FIG. 31 maps start block 2920 in the C-style API to start block identifier URI field 2920*b* and maps number of blocks 2930 in the C-style API to number of blocks URI field 2930*b*.

Figure 32:
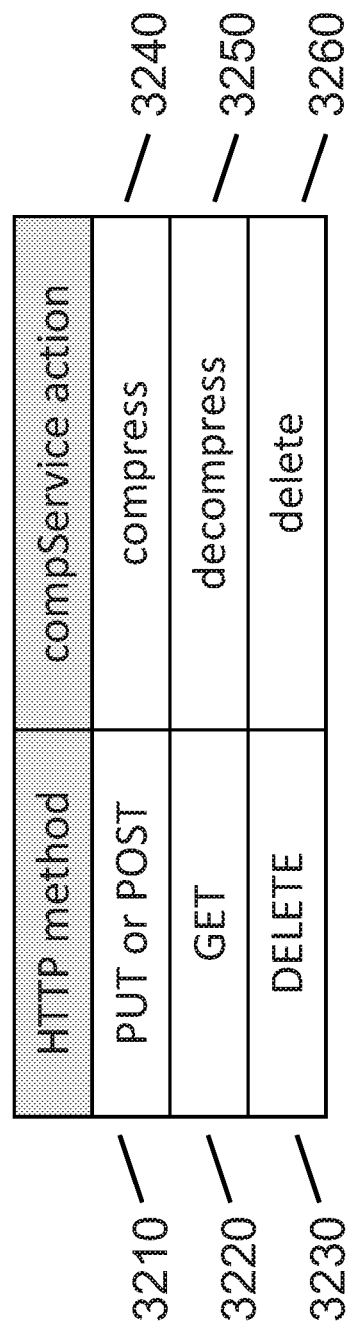
FIG. 32 illustrates an example mapping between HTTP methods and the compress and decompress operations.

RESTful APIs often utilize the HTTP (HyperText Transfer Protocol) or HTTPS (secure HTTP) protocol to transfer and/or process data. The HTTP protocol typically includes a number of methods (also called "verbs" that describe an action), including GET, PUT, POST, DELETE, and LIST. For the technology described herein, FIG. 32 illustrates one way that existing HTTP methods could be mapped to the compress, decompress, and delete operations used by the technology described herein. For instance, PUT or POST methods 3210 could initiate compression (encoding) function 3240. Similarly, the GET method 3220 could initiate decompress function 3250, and the DELETE method could be mapped to delete operation 3260 of the technology described herein, deleting data associated with input data URI 3010, compressed data URI 3020 or 3110, compressed block size lists 3030 or 3120, or decoded data URI 3130. FIG. 32 illustrates one example mapping between HTTP or HTTPS methods and corresponding compress and decompress actions of the technology described herein; other mappings are possible.

Programming or URI naming conventions that associate both a compress or decompress operation with a data object to be compressed or decompressed are possible. For instance, an encoder or decoder operation could be specified in the URI itself (such as "http://compress.compService.com/ . . . " or "http://decode.compService.com/ . . . "). Such decisions about implementation styles may be determined by a Web programmer or a data architect.

As used in this specification and its associated claims, the term "logic" is used to describe multiple methods to embody methods for encoding and decoding to provide encoding and decoding engines, such as software used to configure or to program certain compatible hardware. For instance, a sequence of instructions conforming to an instruction set for a central processing unit (CPU) is one example of "logic." A second example of "logic" might include a programming bitfile for a Field Programmable Gate Array (FPGA), which configures groups of lookup tables (LUTs), Digital Signal Processing (DSP) computational units, storage (such as block RAMs, registers, or similar storage elements), and interconnect fabric (including local and global routing resources. A third example of "logic" might include a sequence of instructions conforming to an instruction set for a graphics processing unit (GPU). A fourth example of "logic" might include a dedicated hardware encoder or decoder that may be configured by (say) specifying an encoding block size via a register. The term "logic" generally describes the ability to specify the selectable or programmable behavior of certain configurable hardware elements.

The technology described herein and its related encoded block format can be applied to both storage and transmission systems. In storage systems, encoded blocks are stored in the encoded block format and may be accompanied by an associated list of block lengths, where each block length describes the size of its associated encoded block. In transmission systems, such as those skilled in the art of information processing are familiar with, including Ethernet, Infiniband, and similar transmission formats, the transmitter may encode transmitted data into the encoded block format prior to transmission, while the receiver may decode encoded data blocks received in the encoded block format to create decoded data. This specification also anticipates the use of the technology described herein in future information technology systems that may combine storage and transmission, such as the new (as of 2017) NVMe [Non-Volatile Memory Express] over Fabrics specification, sometimes abbreviated as NVMe-oF or NVMeoF.

Certain implementation details of the technology described herein, such as ensuring identity and access security (only allowing access to the compress or decompress Web service to authorized users, such as to those users who have agreed to pay for such a service), or ways of billing customers for a compress+decompress service, have been omitted. However, such services are already (as of 2016) commonly available. For example, Amazon, Microsoft, and Google offer the following security, identity, and billing services:

Cloud security and identity services:
AWS Identity and Access Management (IAM)
AWS Directory Service
AWS Certificate Manager
Microsoft Azure Active Directory
Microsoft Azure Virtual Private Network (VPN)
Google Compute Platform Identity and Access Management (IAM) Roles
Google Cloud Virtual Private Network (VPN)
Cloud billing services:
AWS DevPay
AWS Marketplace
AWS Account Services
Microsoft Azure Billing APIs (Usage API, RateCard API)
Google Cloud Billing APIs (many)

Certain extensions of the technology described herein are anticipated. For example, as shown in FIG. 10, encoder 212 may be implemented using two or more software threads, FPGA RTL hardware instances, or SoC (ASIC) hardware instances. Similarly, as shown in FIG. 11, decoder 262 may be implemented using two or more software threads, FPGA RTL hardware instances, or SoC (ASIC) hardware instances. Additional multi-Byte events that are not identified in this patent application may be detected by a future multi-Byte event detector 1010 as show in example encoder 212. Additional multi-Byte events may be decoded by decoder 262 in FIG. 11, resulting in additional (or modified) outputs from header decoder 1104 and payload decoder 1108. As described in FIGS. 14-18, two equivalent random access specifiers {startByte, NBytes} and {startByte, endByte} could be used by decoder 262 to specify the location of the desired decoded elements (typically Bytes).

A variety of implementations that use the present encoded block format are anticipated, such as software implementations that use Cloud micro-services, such as AWS Lambda, Microsoft Azure Functions, Google Compute Functions, or Docker containers. Similarly, FPGA implementations that use the present encoded block format are anticipated, such as FPGA implementations using Xilinx FPGAs in AWS FI Instances, or Altera/Intel FPGAs in Microsoft Project Olympus. Similarly, SoC/ASIC implementations that use the present encoded block format are anticipated, such as in solid state disk (SSD) controllers manufactured by companies such as Samsung, Marvell, Silicon Motion, Phison, jMicron, etc. Other SoC/ASIC implementations that use the present encoded block format are anticipated that decrease the size and accelerate the transfer of data stored in dynamic random-access memory (DRAM), on-chip caches, and new memory technologies, such as the 3D Xpoint memory co-developed by Intel and Micron.

In a preferred embodiment, when the encoded block size 215 set to a cache line size (typically 64 Bytes or 128 Bytes), encoder 212 will generate encoded blocks that conform to the format. This use case (decreasing the size of data stored in cache lines and thus transferring the encoded data more quickly, relative to un-encoded cache lines, as well as increasing the capacity of DRAM and on-chip cache) is also anticipated by this application.

Instead of the header portion of the technology described herein containing unique values (such as unique literals or sequence lengths) in descending frequency order, the unique values could alternately be sent in sequential order (from smallest to largest value, or from largest to smallest value), along with their frequency counts or frequency "position" in an ordered list. Typically this alternate encoding method would require more bits than the method described in most examples in this application, but the information could nevertheless be conveyed in this (or another) manner. The innovation consists in first listing (enumerating) unique values in a header, and then by using that enumerated list in conjunction with a related payload whose list of values are encoded according to the enumerated list. There are multiple ways (including those methods listed above) to enumerate the list of unique parameters in a header.

The all or parts of methods described herein can be embodied by logic in a computer system and in a computer program product, represented by instructions executable by a computer, including configuration data executable by an FPGA element of a computer, stored in a non-transitory computer readable medium. A "non-transitory computer readable medium" as used herein includes one or more memory devices of the same or different types of memory technology, such as SRAM, DRAM, Flash Memory, EEPROM, magnetic disk memory, magnetic tape, CDs (compact discs), DVDs (digital versatile discs or digital video discs), or other media capable of storing data, which are readable by a computer for the purposes of retrieving and storing executable instructions and configuration data.

The utility of the encoded block format is not limited to those examples described in this specification, but is only limited by the claims associated with, or related to, the technology described herein.

With all methods flowcharts herein, it will be appreciated that many of the steps can be combined, performed in parallel or performed in a different sequence without affecting the functions achieved. In some cases, as the reader will appreciate, a re-arrangement of steps will achieve the same results only if certain other changes are made as well. In other cases, as the reader will appreciate, a re-arrangement of steps will achieve the same results only if certain conditions are satisfied.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An encoding method that encodes an input dataset, comprising:

reading a plurality of data blocks of block size N, where N is a number of bytes, of the input data set;

using a plurality of cores of a multicore processor, encoding data blocks of the input data set into a plurality of encoded data blocks having variant block sizes, at least one of the encoded data blocks having a block size less than N, including concurrently encoding a first data block of the plurality of data blocks of the input dataset into a first losslessly encoded data block using a first core in the plurality of cores, and a second data block of the plurality of data blocks of the input dataset into a second losslessly encoded data block using a second core in the plurality of cores; and storing or transmitting the plurality of encoded data blocks;

wherein at least one of the losslessly encoded data blocks contains one or more headers and one or more payloads, and:

each header represents a list of unique single-Byte parameters and a list of unique multi-byte parameters having an encoding format different from that of the list of single-byte parameters; and each payload includes tokens that identify a sequence of single-Byte and multi-Byte parameters whose contents are identified in at least one header.

2. The method of claim 1, including generating metadata that includes the sizes of encoded data blocks of the plurality of encoded data blocks.

3. A computer system that encodes an input dataset, comprising:

a multicore processor, memory and a communication interface, including instructions executable by the processor to read a plurality of data blocks of block size N, where N is a number of bytes, of the input data set;

use a plurality of cores of the multicore processor, to encode data blocks of the input data set into a plurality of encoded data blocks having variant block sizes, at least one of the encoded data blocks having a block size less than N, including concurrently encoding a first data block of the plurality of data blocks of the input dataset into a first losslessly encoded data block using a first core in the plurality of cores, and a second data block of the plurality of data blocks of the input dataset into a second losslessly encoded data block using a second core in the plurality of cores; and store or transmit the plurality of encoded data blocks;

wherein at least one of the losslessly encoded data blocks contains one or more headers and one or more payloads, and:

each header represents a list of unique single-Byte parameters and a list of unique multi-byte parameters having an encoding format different from that of the list of single-byte parameters; and each payload includes tokens that identify a sequence of single-Byte and multi-Byte parameters whose contents are identified in at least one header.

4. The system of claim 3, further including instructions executable by the processor to generate metadata that includes the sizes of encoded data blocks of the plurality of encoded data blocks.

5. A computer program product comprising a non-transitory computer readable medium for a method that encodes an input dataset, comprising:

instructions executable by a multicore processor stored in the computer readable medium to read a plurality of data blocks of block size N, where N is a number of bytes, of the input data set;

use a plurality of cores of the multicore processor, to encode data blocks of the input data set into a plurality of encoded data blocks having variant block sizes, at least one of the encoded data blocks having a block size less than N, including concurrently encoding a first data block of the plurality of data blocks of the input dataset into a first losslessly encoded data block using a first core in the plurality of cores, and a second data block of the plurality of data blocks of the input dataset into a second losslessly encoded data block using a second core in the plurality of cores; and store or transmit the plurality of encoded data blocks;

wherein at least one of the losslessly encoded data blocks contains one or more headers and one or more payloads, and:

each header represents a list of unique single-Byte parameters and a list of unique multi-byte parameters having an encoding format different from that of the list of single-byte parameters; and each payload includes tokens that identify a sequence of single-Byte and multi-Byte parameters whose contents are identified in at least one header.

6. The computer program product of claim 5, further including instructions executable by the processor to generate metadata that includes the sizes of encoded data blocks of the plurality of encoded data blocks.

* * * * *